United States Patent
Okada et al.

(10) Patent No.: US 11,496,125 B2
(45) Date of Patent: Nov. 8, 2022

(54) SWITCH CIRCUIT CAPABLE OF OVERCURRENT PROTECTION WITH SMALL AND SIMPLE CIRCUIT, AND WITH SIMPLE OPERATION, WITHOUT AFFECTING NORMAL OPERATION

(71) Applicant: OMRON Corporation, Kyoto (JP)

(72) Inventors: Wataru Okada, Kizugawa (JP); Satoshi Iwai, Hirakata (JP); Noriyuki Nosaka, Nara (JP); Takeo Nishikawa, Kyoto (JP); Kenji Kobayashi, Moriyama (JP); Keiji Shiraishi, Takatsuki (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 17/259,512

(22) PCT Filed: Mar. 11, 2019

(86) PCT No.: PCT/JP2019/009733
§ 371 (c)(1),
(2) Date: Jan. 11, 2021

(87) PCT Pub. No.: WO2020/021757
PCT Pub. Date: Jan. 30, 2020

(65) Prior Publication Data
US 2021/0242864 A1     Aug. 5, 2021

(30) Foreign Application Priority Data

Jul. 26, 2018  (JP) .............................. JP2018-140092

(51) Int. Cl.
*H03K 17/0812* (2006.01)
*H02H 9/02* (2006.01)
(Continued)

(52) U.S. Cl.
CPC ......... *H03K 17/08128* (2013.01); *H02H 9/02* (2013.01); *H02M 1/08* (2013.01); *H02M 1/32* (2013.01)

(58) Field of Classification Search
CPC ........ H03K 17/08128; H03K 17/0822; H02M 1/08; H02M 1/32; H02M 3/156; H02M 3/158; H02M 7/5387; H02H 9/02
See application file for complete search history.

(56) References Cited

U.S. PATENT DOCUMENTS 6,717,785 B2 *  4/2004  Fukuda ............... H03K 17/0828
                                                    361/86
6,842,064 B2 *  1/2005  Yamamoto ......... H03K 17/0828
                                                    323/276
(Continued)

FOREIGN PATENT DOCUMENTS

CN     106027011 A    10/2016
JP     H0964707 A     3/1997
(Continued)

OTHER PUBLICATIONS

JPO Notice of Reasons for Refusal for corresponding JP Patent Application No. 2018-140092; dated Oct. 5, 2021.
(Continued)

*Primary Examiner* — Scott Bauer
(74) *Attorney, Agent, or Firm* — Cantor Colburn LLP

(57) ABSTRACT

A driver circuit controls a first switch element. A first resistor is connected between the driver circuit and the first switch element. A second switch element is connected to the first switch element. An overcurrent detector circuit controls the second switch element based on an overcurrent current flowing through the first switch element. A second resistor is connected between the overcurrent detector circuit and the second switch element. The first and second resistor is set such that a turn-off time of the first switch element when the (Continued)

second switch element is turned on by the overcurrent detector circuit is longer than a turn-off time of the first switch element when the first switch element is turned off by the driver circuit.

7 Claims, 16 Drawing Sheets

(51) Int. Cl.
*H02M 1/08* (2006.01)
*H02M 1/32* (2007.01)

(56) References Cited

U.S. PATENT DOCUMENTS

| | | | | |
|---|---|---|---|---|
| 7,483,250 | B2* | 1/2009 | Ishikawa | H03K 17/0828 |
| | | | | 361/87 |
| 8,466,734 | B2* | 6/2013 | Mori | H03K 17/0828 |
| | | | | 361/87 |
| 8,687,327 | B2* | 4/2014 | Watanabe | B60L 15/007 |
| | | | | 361/18 |
| 9,570,905 | B2* | 2/2017 | Koishi | H03K 17/163 |
| 2002/0176215 | A1 | 11/2002 | Hiyama et al. | |
| 2004/0252435 | A1 | 12/2004 | Ishikawa et al. | |
| 2012/0013370 | A1 | 1/2012 | Mori | |
| 2016/0126718 | A1 | 5/2016 | Naito et al. | |
| 2019/0058388 | A1 | 2/2019 | Tsubamoto et al. | |

FOREIGN PATENT DOCUMENTS

| | | |
|---|---|---|
| JP | 2000224837 A | 8/2000 |
| JP | 2002353795 A | 12/2002 |
| JP | 20056381 A | 1/2005 |
| JP | 2007104805 A | 4/2007 |
| JP | 2012023899 A | 2/2012 |
| JP | 2012070261 A | 4/2012 |
| JP | 5571594 B2 | 8/2014 |
| JP | 2016092907 A | 5/2016 |
| JP | 2017175771 A | 9/2017 |

OTHER PUBLICATIONS

PCT International Preliminary Report on Patentability with Written Opinion of the International Searching Authority for International Application No. PCT/JP2019/09733, dated Feb. 4, 2021.
International Search Report for International Application No. PCT/JP2019/009733; dated May 28, 2019.
PCT Written Opinion of the International Searching Authority for International Application No. PCT/JP2019/009733; dated May 28, 2019.
EPO Extended European Search Report for corresponding EP Application No. 19840146.5; dated Mar. 11, 2022.

* cited by examiner

SWITCH CIRCUIT CAPABLE OF OVERCURRENT PROTECTION WITH SMALL AND SIMPLE CIRCUIT, AND WITH SIMPLE OPERATION, WITHOUT AFFECTING NORMAL OPERATION

CROSS REFERENCE TO RELATED APPLICATIONS

This is the U.S. national stage of application No. PCT/JP2019/009733, filed Mar. 11, 2019. Priority under 35 U.S.C. § 119(a) and 35 U.S.C. § 365(b) is claimed from Japanese Application No. 2018-140092, filed Jul. 26, 2018, the disclosure of which is also incorporated herein by reference.

TECHNICAL FIELD

The present disclosure relates to a switch circuit including switch elements and a control circuit thereof, and also relates to a power converter apparatus including at least one such switch circuit.

BACKGROUND ART

Conventionally, switching power supply apparatuses with overcurrent protection have been known as disclosed in, for example, Patent Documents 1 and 2.

Patent Document 1 discloses a gate driver circuit for a voltage-driven semiconductor element used in a power converter apparatus. In this gate driver circuit, a series-connected circuit of first and second resistors is connected between a signal output terminal of a signal insulator, and control terminals of semiconductor elements connected to a gate terminal of the voltage-driven semiconductor element, the semiconductor elements being complementarily operable to flow a gate current of the voltage-driven semiconductor element. A switch element is connected between a connection point connecting the first resistor to the second resistor, and an emitter terminal of the voltage-driven semiconductor element, the switch element being turned on in order to forcibly turn the voltage-driven semiconductor element off when an overcurrent flows through the voltage-driven semiconductor element. Further, a capacitor is connected between a connection point connecting the second resistor to control terminals of the semiconductor elements, and an emitter terminal of the voltage-driven semiconductor element.

Patent Document 2 discloses a single-ended forward switching power supply apparatus having an overcurrent protection function and including a synchronous rectifier circuit. This switching power supply apparatus is provided with: a main switching element, a current detector circuit, a PWM control circuit, a variable resistor element, and a variable control circuit, on a primary side of a main transformer. The current detector circuit detects a switching current flowing through the main switching element. The PWM control circuit controls ON and OFF of the main switching element, receives an output signal of the current detector circuit, and shortens an ON time of the main switching element when a peak value of the switching current reaches a first reference value. The variable resistor element is connected between gate and source terminals of the main switching element. The variable control circuit receives the output signal of the current detector circuit, compares the peak value of the switching current with a second reference value at each switching period, and when the switching current reaches the second reference value, reduces a resistance of the variable resistor element so as not to increase a voltage between the gate and source terminals of the main switching element, thus preventing an increase in the peak value of the switching current.

CITATION LIST

Patent Documents

PATENT DOCUMENT 1: Japanese Patent Laid-open Publication No. JP 2007-104805 A
PATENT DOCUMENT 2: Japanese Patent No. JP 5571594 B

SUMMARY OF INVENTION

Technical Problem

According to the gate driver circuit of Patent Document 1, many components for overcurrent protection are connected between the signal insulator and the voltage-driven semiconductor element. Due to such many components, the circuit's scale and cost increase. The increase in the circuit's scale results in an increase in inductance. On the other hand, driver circuits for next-generation high-speed power semiconductor elements, including super junction MOSFET (SJ-MOS), SiC, GaN, etc., need to have low inductance so as to reduce driving noise. Accordingly, in order to reduce the cost and also reduce the inductance, it is necessary to achieve overcurrent protection with a circuit smaller and simpler than that of the prior art.

In addition, according to the gate driver circuit of Patent Document 1, the semiconductor elements operable complementarily are provided between the switch element for overcurrent protection and the voltage-driven semiconductor element. Due to the presence of these semiconductor elements, when an overcurrent in the voltage-driven semiconductor element is detected, a delay occurs from turning on of the switch element for overcurrent protection, to turning off of the voltage-driven semiconductor element. Accordingly, in order to shorten an operating time from detection of an overcurrent to protection against the overcurrent, it is necessary to achieve overcurrent protection with a circuit smaller and simpler than that of the prior art.

In addition, according to the gate driver circuit of Patent Document 1, turning on or off of the voltage-driven semiconductor element is followed by charging or discharging of the capacitor for a time depending on a time constant of the second resistor and the capacitor, and the charging or discharge time results in a delay in an operation of the voltage-driven semiconductor element. This delay occurs not only when detecting the overcurrent in the voltage-driven semiconductor element and protecting the voltage-driven semiconductor element from the overcurrent, but also during a normal operation of the voltage-driven semiconductor element. Thus, a switching speed of the voltage-driven semiconductor element during the normal operation is slowed, and a loss increases. Accordingly, it is necessary to achieve overcurrent protection without affecting the normal operation.

In addition, according to the switching power supply apparatus of Patent Document 2, when an overcurrent in the main switching element is detected, two-stage overcurrent protection is performed: preventing the increase in the peak value of the switching current by the variable control circuit and the variable resistor element, and then, blocking the switching current by the PWM control circuit. By performing the two-stage operation, a delay occurs from detection of an overcurrent to protection against the overcurrent. Accordingly, in order to shorten the operating time from detection of an overcurrent to protection against the overcurrent, it is necessary to achieve overcurrent protection with a circuit and an operation simpler than those of the prior art.

An object of the present disclosure is to provide a switch circuit including switch elements and a control circuit thereof, the switch circuit being capable of achieving overcurrent protection with a circuit smaller and simpler than that of the prior art, and with an operation simpler than that of the prior art, without affecting a normal operation. In addition, another object of the present disclosure is to provide a power converter apparatus including at least one such switch circuit.

Solution to Problem

In order to solve the above-mentioned problem, a switch circuit and a power converter apparatus according to aspects of the present disclosure are configured as follows.

A switch circuit according to an aspect of the present disclosure is provided with: a first switch element, a driver circuit, a first resistor, a second switch element, an overcurrent detector circuit, and a second resistor. The first switch element has a first terminal connected to a first voltage source, a second terminal connected to a second voltage source, and a third terminal. The driver circuit that generates a first control signal for turning the first switch element on and off. The first resistor is connected between the driver circuit and the third terminal. The second switch element has a fourth terminal connected to the third terminal, a fifth terminal connected to the second voltage source, and a sixth terminal. The overcurrent detector circuit generates a second control signal for turning the second switch element on and off, based on whether or not a current flowing through the first switch element exceeds a predetermined threshold. The second resistor is connected between the overcurrent detector circuit and the sixth terminal. The first and second resistors have resistances set such that a turn-off time of the first switch element when the second switch element is turned on by the second control signal is longer than a turn-off time of the first switch element when the first switch element is turned off by the first control signal.

In this case, "the first switch element" is a power semiconductor element to which a voltage of the first voltage source is applied, and which passes and blocks a current from the first voltage source. In addition, "the second switch element" turns the first switch element off using soft turn-off when detecting an overcurrent in the first switch element. The "soft turn-off" means changing a signal level of a control signal to be applied to a switch element, when turning the switch element off.

The second switch element, the overcurrent detector circuit, and the second resistor constitute an overcurrent protection circuit for the first switch element, the overcurrent protection circuit detecting an overcurrent in the first switch element, and protecting the first switch element from the overcurrent. In addition, the driver circuit, the first resistor, the second switch element, the overcurrent detector circuit, and the second resistor constitute a control circuit for the first switch element, the control circuit turning the first switch element on and off, detecting an overcurrent in the first switch element, and protecting the first switch element from the overcurrent.

Since the switch circuit according to the aspect of the present disclosure is configured as described above, it is possible to achieve overcurrent protection with a circuit smaller and simpler than that of the prior art, and with an operation simpler than that of the prior art, without affecting a normal operation.

The switch circuit according to the aspect of the present disclosure may be further provided with a capacitor that is connected between the fifth and sixth terminals of the second switch element.

Since the switch circuit according to the aspect of the present disclosure is provided with the capacitor, a malfunction of the second switch element due to a mirror current is less likely to occur.

In the switch circuit according to the aspect of the present disclosure, when turning the second switch element off, the overcurrent detector circuit may generate the second control signal having a polarity opposite to a polarity of an electric potential of the first voltage source, with respect to an electric potential of the second voltage source.

Since the switch circuit according to the aspect of the present disclosure generates the second control signal as described above, a malfunction of the second switch element due to a mirror current is less likely to occur.

In the switch circuit according to the aspect of the present disclosure, the first resistor may be integrated with the driver circuit.

Since the switch circuit according to the aspect of the present disclosure is configured as described above, it is possible to further reduce the size of the switch circuit and simplify the switch circuit.

In the switch circuit according to the aspect of the present disclosure, the second switch element may be an NPN transistor or an N-channel MOSFET. The overcurrent detector circuit may set the second control signal to a high level when the current flowing through the first switch element exceeds the threshold, and set the second control signal to a low level when the current flowing through the first switch element is equal to or smaller than the threshold.

In the switch circuit according to the aspect of the present disclosure, the second switch element is a PNP transistor or a P-channel MOSFET. The overcurrent detector circuit may set the second control signal to a low level when the current flowing through the first switch element exceeds the threshold, and set the second control signal to a high level when the current flowing through the first switch element is equal to or smaller than the threshold.

Since the switch circuit according to the aspect of the present disclosure is configured as described above, the overcurrent detector circuit can be appropriately selected according to the specifications of the second switch element, and the second switch element can be appropriately selected according to the specifications of the overcurrent detector circuit.

A power converter apparatus according to an aspect of the present disclosure is provided with at least one of the switch circuit according to the aspect of the present disclosure.

Since the power converter apparatus according to the aspect of the present disclosure is configured as described above, it is possible to achieve overcurrent protection with a circuit smaller and simpler than that of the prior art, and with an operation simpler than that of the prior art, without affecting a normal operation.

Advantageous Effects of Invention

According to the present disclosure, it is possible to provide the switch circuit capable of achieving overcurrent protection with a circuit smaller and simpler than that of the prior art, and with an operation simpler than that of the prior art, without affecting a normal operation.

In addition, according to the present disclosure, it is possible to provide a power converter apparatus including at least one such switch circuit.

DESCRIPTION OF EMBODIMENTS

Figure 1:
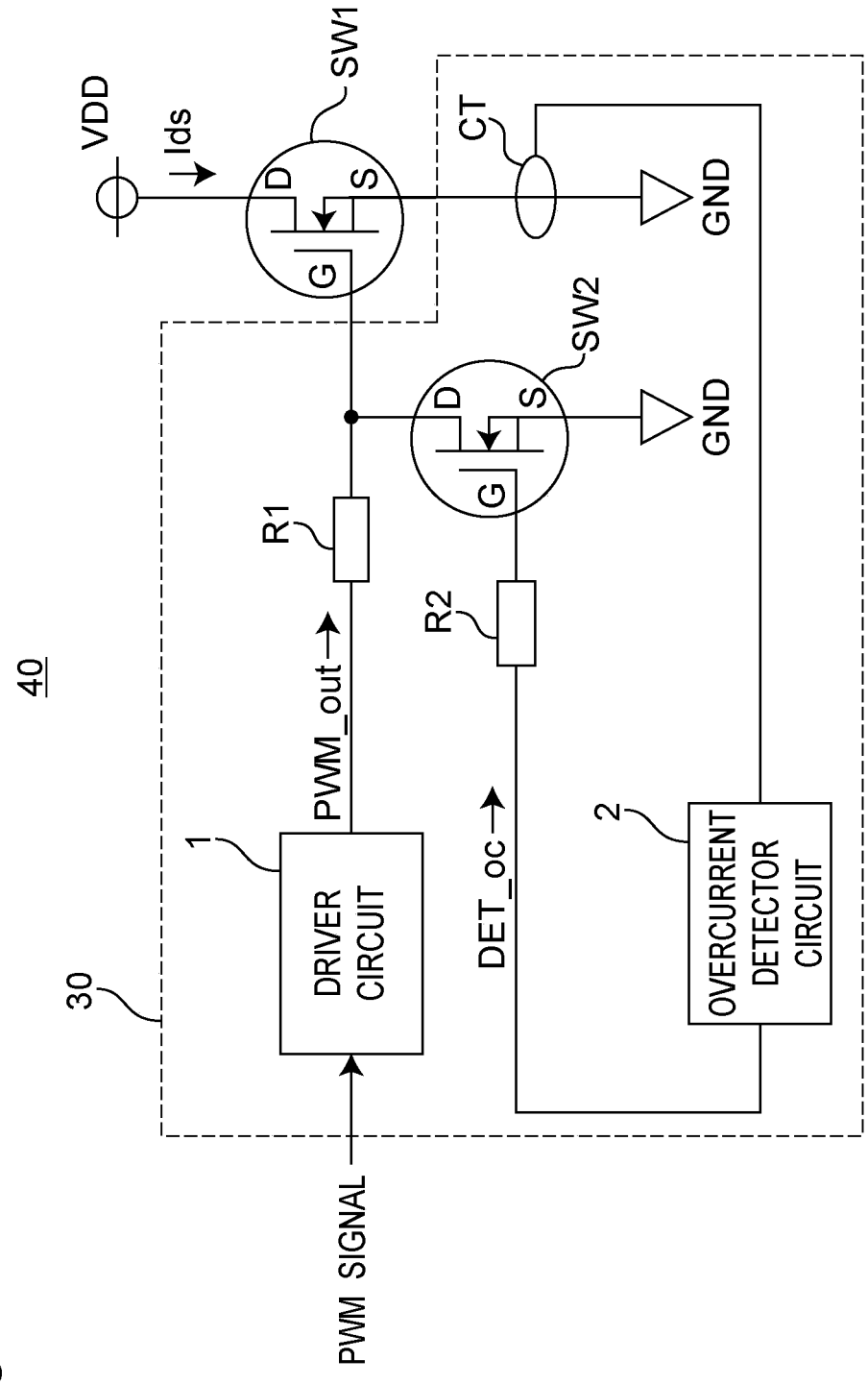
FIG. 1 is a circuit diagram schematically illustrating an exemplary configuration of a switch circuit 40 according to a first embodiment.

Hereinafter, embodiments according to an aspect of the present disclosure (hereinafter, also referred to as "the present embodiment") will be described with reference to the drawings. In the drawings, the same reference characters indicate similar components.

First Embodiment

A switch circuit according to a first embodiment will be described with reference to FIGS. 1 to 13.

Exemplary Configuration of First Embodiment

FIG. 1 is a circuit diagram schematically illustrating an exemplary configuration of a switch circuit 40 according to the first embodiment. The switch circuit 40 of FIG. 1 is provided with: a switch element SW1, a driver circuit 1, a resistor R1, a switch element SW2, an overcurrent detector circuit 2, and a resistor R2. The switch element SW2, the overcurrent detector circuit 2, and the resistor R2 constitute an overcurrent protection circuit for the switch element SW1, the overcurrent protection circuit detecting an overcurrent in the switch element SW1, and protecting the switch element SW1 from the overcurrent. In addition, the driver circuit 1, the resistor R1, the switch element SW2, the overcurrent detector circuit 2, and the resistor R2 constitute a control circuit 30 for the switch element SW1, the control circuit 30 turning the switch element SW1 on and off, detecting an overcurrent in the switch element SW1, and protecting the switch element SW1 from the overcurrent.

The switch element SW1 has a drain terminal D connected to a voltage source VDD, a source terminal S connected to a ground GND, and a gate terminal G. The switch element SW1 is a power semiconductor element to which a voltage of the voltage source VDD is applied, and which passes and blocks a current from the voltage source VDD. The switch element SW1 is an N-channel MOSFET. An electric potential of the voltage source VDD is higher than an electric potential of the ground GND.

The switch element SW1 is, herein, also referred to as a "first switch element". In addition, herein, the drain terminal D of the switch element SW1 is also referred to as a "first terminal", the source terminal S thereof is also referred to as a "second terminal", and the gate terminal G thereof is also referred to as a "third terminal". In addition, herein, the voltage source VDD is also referred to as a "first voltage source", and the ground GND is also referred to as a "second voltage source". The voltage sources VDD and ground GND are examples of the "first voltage source" and the "second voltage source", respectively. In addition, the switch element SW1 which is an N-channel MOSFET is an example of the "first switch element".

The driver circuit 1 generates a control signal PWM_out for turning the switch element SW1 on and off with a certain duty cycle. For example, a PWM signal is inputted from a previous-stage circuit (not shown) to the driver circuit 1, and the driver circuit 1 generates and outputs a control signal PWM_out based on the PWM signal. When the switch element SW1 is an N-channel MOSFET as described above, the control signal PWM_out becomes a high level when turning the switch element SW1 on, and the control signal PWM_out becomes a low level when turning the switch element SW1 off.

The control signal PWM_out is, herein, also referred to as a "first control signal".

The resistor R1 is connected between the driver circuit 1 and the gate terminal G of the switch element SW1.

The resistor R1 is, herein, also referred to as a "first resistor".

The switch element SW2 has a drain terminal D connected to the gate terminal G of the switch element SW1, a source terminal S connected to a terminal having the same electric potential as the electric potential of the source terminal S of the switch element SW1 (in the example of FIG. 1, the ground GND), and a gate terminal G. The switch element SW2 turns the switch element SW1 off using soft turn-off when detecting the overcurrent in the switch element SW1. The switch element SW2 is an N-channel MOSFET.

The switch element SW2 is, herein, also referred to as a "second switch element". In addition, herein, the drain terminal D of the switch element SW2 is also referred to as a "fourth terminal", the source terminal S thereof is also referred to as a "fifth terminal", and the gate terminal G thereof is also referred to as a "sixth terminal". The switch element SW2 which is the N-channel MOSFET is an example of the "second switch element".

The overcurrent detector circuit 2 generates a control signal DET_oc for turning the switch element SW2 on and off, based on whether or not a current flowing through the switch element SW1 exceeds a predetermined threshold Ith. In order to detect the overcurrent flowing through the switch element SW1, the switch circuit 40 of FIG. 1 is further provided with a current detector CT. The current detector CT is, for example, a current transformer. In a case where the switch element SW2 is the N-channel MOSFET as described above, the overcurrent detector circuit 2 sets the control signal DET_oc to a high level when the current flowing through the switch element SW1 exceeds the threshold Ith, and sets the control signal DET_oc to a low level when the current flowing through the element SW1 is equal to or smaller than the threshold Ith.

The control signal DET_oc is, herein, also referred to as a "second control signal".

The resistor R2 is connected between the overcurrent detector circuit 2 and the gate terminal G of the switch element SW2.

The resistor R2 is, herein, also referred to as a "second resistor".

The resistors R1 and R2 have resistances set such that a turn-off time T2 of the switch element SW1 when the switch element SW2 is turned on by the control signal DET_oc is longer than a turn-off time T1 of the switch element SW1 when the switch element SW1 is turned off by the control signal PWM_out.

Exemplary Operation of First Embodiment

Figure 2:
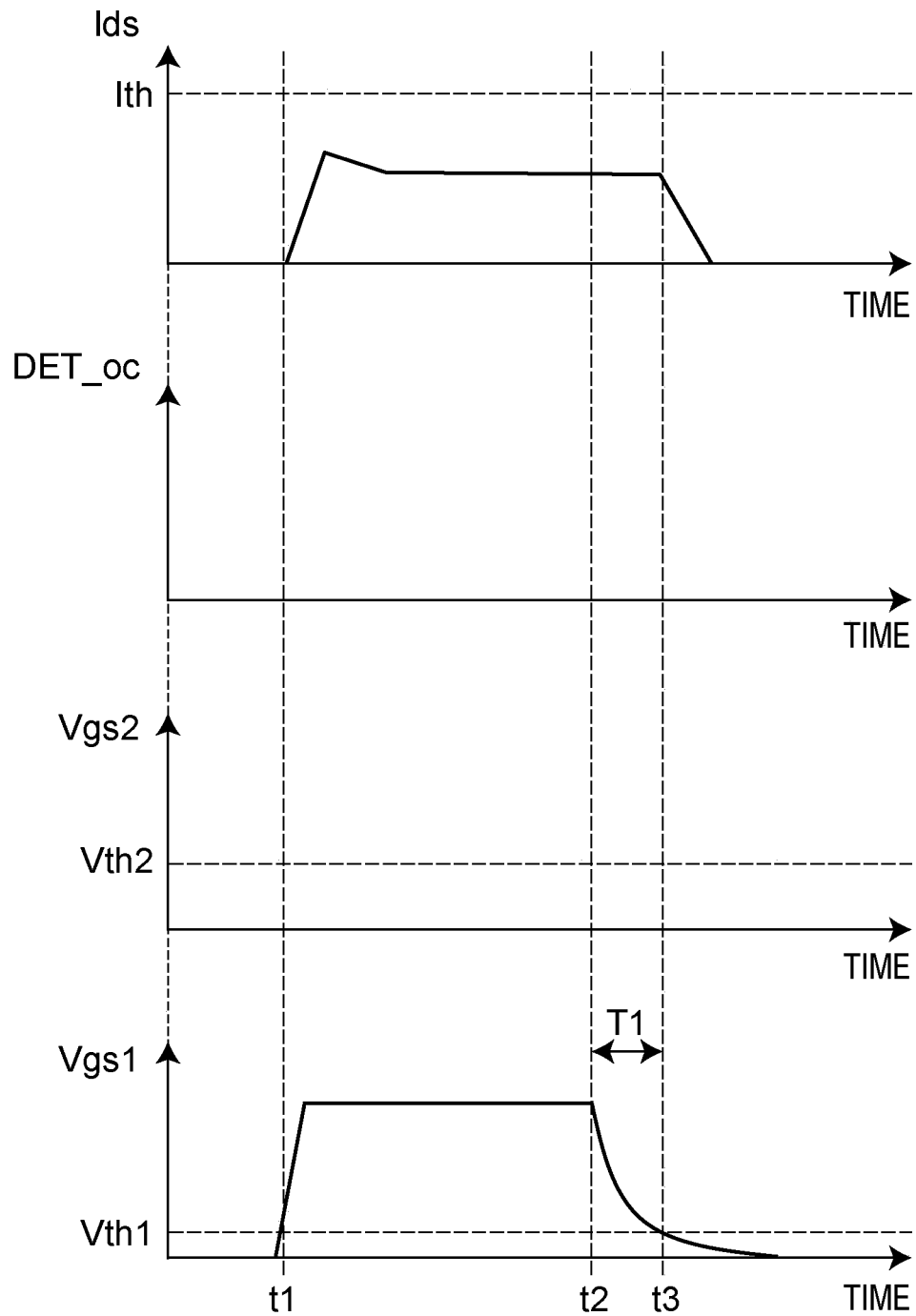
FIG. 2 is a waveform diagram schematically illustrating an exemplary operation of the switch circuit 40 of FIG. 1 during a normal operation.

FIG. 2 is a waveform diagram schematically illustrating an exemplary operation of the switch circuit 40 of FIG. 1 during a normal operation. A first graph of FIG. 2 shows a current Ids flowing through the switch element SW1. Ith denotes a threshold of the overcurrent. A second graph of FIG. 2 shows the control signal DET_oc outputted from the overcurrent detector circuit 2. A third graph of FIG. 2 shows a gate-source voltage Vgs2 applied to the switch element SW2. Vth2 denotes a gate threshold voltage of the switch element SW2. A fourth graph of FIG. 2 shows a gate-source voltage Vgs1 applied to the switch element SW1. Vth1 denotes a gate threshold voltage of the switch element SW1.

In the example of FIG. 2, since the current Ids is always equal to or smaller than the threshold Ith (that is, an overcurrent has not occurred in the switch element SW1), the control signal DET_oc is kept at the low level, and thus, the switch element SW2 is kept off. In this case, the switch element SW1 operates according to the control signal PWM_out outputted from the driver circuit 1 (referred to as a "normal operation"). When the control signal PWM_out transitions from the low level to the high level, the gate-source voltage Vgs1 of the switch element SW1 starts to increase. Thereafter, when the gate-source voltage Vgs1 exceeds the gate threshold voltage Vth1 (time t1), the switch element SW1 is turned on, and the current Ids starts to flow. When the control signal PWM_out transitions from the high level to the low level (time t2), the gate-source voltage Vgs1 starts to decrease. When an overcurrent has not occurred in the switch element SW1, that is, when the switch element SW2 is turned off, the switch element SW1 has a time constant determined by its capacitance (for example, a gate-source capacitance) and the resistor R1. The gate-source voltage Vgs1 gradually decreases over a time depending on the time constant of the switch element SW1. When the gate-source voltage Vgs1 is equal to or smaller than the gate threshold voltage Vth1 (time t3), the switch element SW1 is turned off, and the current Ids starts to decrease. As described above, when an overcurrent has not occurred in the switch element SW1, that is, when the switch element SW2 is turned off, the switch element SW1 has the turn-off time T1 from time t2 to time t3.

Figure 3:
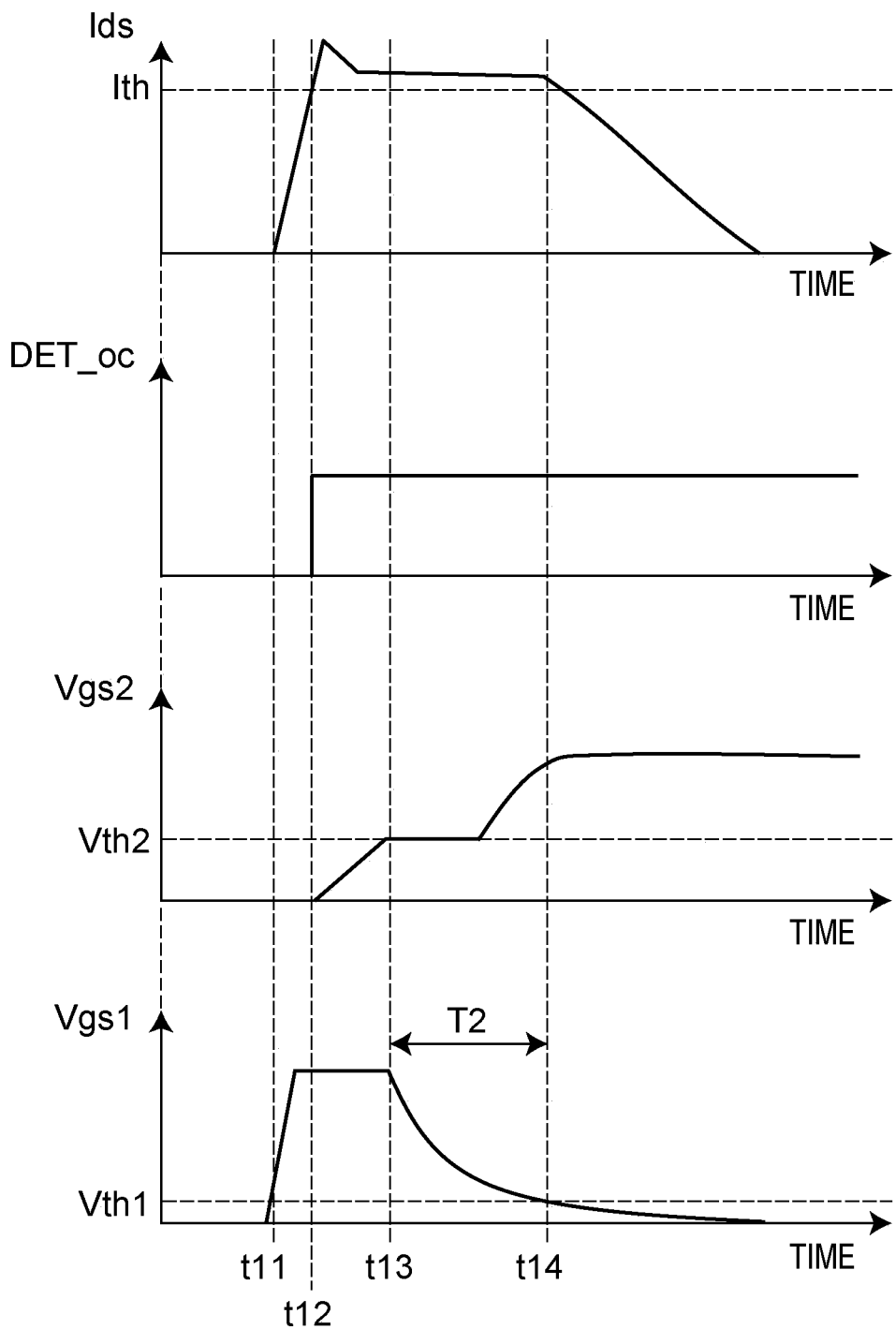
FIG. 3 is a waveform diagram schematically illustrating an exemplary operation of the switch circuit 40 of FIG. 1 when detecting an overcurrent.

FIG. 3 is a waveform diagram schematically illustrating an exemplary operation of the switch circuit 40 of FIG. 1 when detecting an overcurrent. In a manner similar to that of FIG. 2, when the control signal PWM_out transitions from the low level to the high level, the gate-source voltage Vgs1 of the switch element SW1 starts to increase. Thereafter, when the gate-source voltage Vgs1 exceeds the gate threshold voltage Vth1 (time t11), the switch element SW1 is turned on, and the current Ids starts to flow. In the example of FIG. 3, the current Ids becomes larger than the threshold Ith at a time t12 (that is, an overcurrent has occurred in the switch element SW1), and accordingly, the control signal DET_oc transitions from the low level to the high level, and the gate-source voltage Vgs2 of the switch element SW2 starts to increase. When the gate-source voltage Vgs2 reaches the gate threshold voltage Vth2 (time t13), the switch element SW2 is turned on, and the gate-source voltage Vgs1 of the switch element SW1 starts to decrease. When an overcurrent has occurred in the switch element SW1, that is, when the switch element SW2 is turned on, the switch element SW1 has a time constant determined by a capacitance of the switch element SW2 and the resistor R2, as well as the capacitance of the switch element SW1 and the resistor R1. In a manner similar to that of FIG. 2, the gate-source voltage Vgs1 gradually decreases over a time depending on the time constant of the switch element SW1. When the gate-source voltage Vgs1 is equal to or smaller than the gate threshold voltage Vth1 (time t14), the switch element SW1 is turned off, and the current Ids starts to decrease. As described above, when an overcurrent has occurred in the switch element SW1, that is, when the switch element SW2 is turned on, the switch element SW1 has the turn-off time T2 from time t13 to time t14. In addition, in this case, the switch element SW1 is turned off by the switch element SW2 regardless of a state of the control signal PWM_out (that is, even when the control signal PWM_out is kept at the high level).

As described above, the resistances of the resistors R1 and R2 are set such that the turn-off time T2 is longer than the turn-off time T1. Accordingly, when an overcurrent has occurred in the switch element SW1, the gate-source voltage Vgs1 of the switch element SW1 decreases more slowly than during the normal operation, and the switch element SW1 is turned off using soft turn-off. By turning the switch element SW1 off using soft turn-off, a voltage surge is less likely to occur in the switch element SW1.

The turn-off times T1 and T2 can be individually set by adjusting the resistances of the resistors R1 and R2.

The resistance of the resistor R1 may be set to a small value in order to operate the switch element SW1 at a desired switching speed during the normal operation. On the other hand, the resistance of the resistor R2 is set to a large value (for example, a value much larger than the resistance of the resistor R1) in order to turn the switch element SW1 off using soft turn-off when an overcurrent has occurred in the switch element SW1.

Conventionally, a circuit is known in which a gate terminal of a switch element is connected to a driver circuit and an overcurrent protection circuit via first and second resistors different from each other. For example, ROHM Co., Ltd. supplies a gate driver BM6108FV-LBE2 for such a circuit. The gate driver BM6108FV-LBE2 is configured to have a built-in driver circuit and overcurrent protection circuit, and to externally connect the switch element and the resistors. In such a circuit, it is expected to achieve the same operation as that of the switch circuit according to the present embodiment, by using the first and second resistors having different resistances so that the turn-off time during the normal operation and the turn-off time when detecting the overcurrent are set to be different from each other. However, in such a circuit, it is not possible to actually achieve the same operation as that of the switch circuit according to the present embodiment, as described below.

Figure 4:
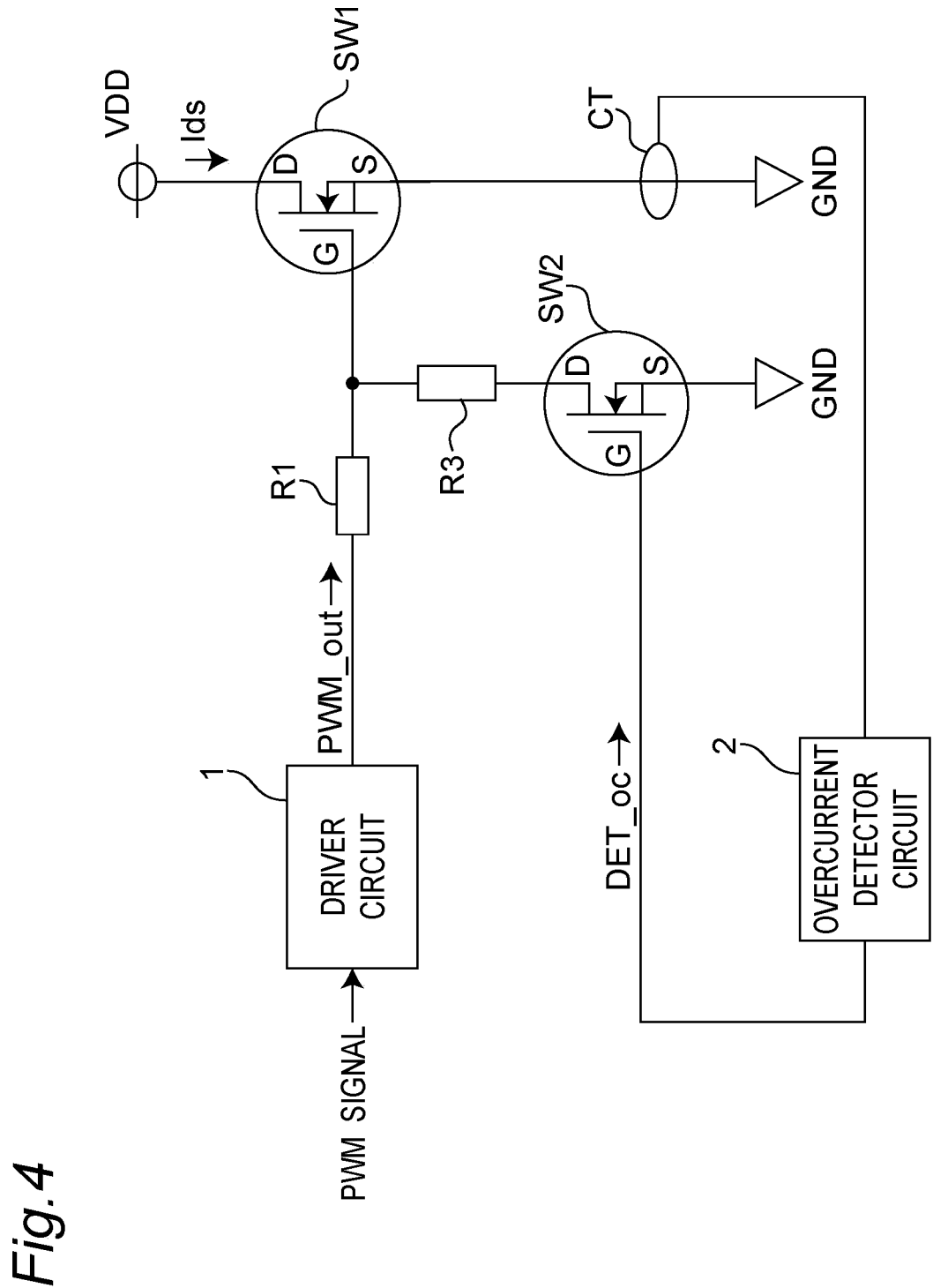
FIG. 4 is a circuit diagram schematically illustrating an exemplary configuration of a switch circuit according to a comparison example.

FIG. 4 is a circuit diagram schematically illustrating an exemplary configuration of a switch circuit according to a comparison example. The switch circuit of FIG. 4 is provided with a resistor R3 connected between the gate terminal G of the switch element SW1 and the drain terminal D of the switch element SW2, instead of the resistor R2 of the switch circuit 40 of FIG. 1.

When the switch element SW2 is turned on, the gate-source voltage Vgs1 of the switch element SW1 is given as follows.

$$Vgs1 = Vdr \times R3/(R1+R3)$$

Where, Vdr denotes a voltage of the control signal PWM_out.

In order to turn the switch element SW1 off using soft turn-off, it is necessary to set R1<<R3. Accordingly, the gate-source voltage Vgs1 almost never decreases from the voltage Vdr as given in the following mathematical expression, and the switch element SW1 cannot be turned off.

$$Vdr \times R3/(R1+R3) \approx Vdr \times R3/(R3) = Vdr$$

As described above, according to the switch circuit of FIG. 4, since the gate-source voltage Vgs1 of the switch element SW1 does not decrease below a voltage determined by a voltage division ratio of the resistors R1 and R3, the switch element SW1 cannot be turned off, even when the switch element SW2 is turned on. Accordingly, in the switch circuit of FIG. 4, it is difficult to achieve the soft turn-off of the switch element SW1.

On the other hand, according to the switch circuit 40 of the present embodiment, when the switch element SW2 is turned off, the gate-source voltage Vgs1 of the switch element SW1 decreases to the electric potential of the ground GND. The switch element SW1 is turned off using soft turn-off at the turn-off time T2 depending on the resistance of the resistor R2. As described above, the switch circuit 40 according to the present embodiment is essentially different from the switch circuit of the comparison example.

Advantageous Effects of First Embodiment

According to the switch circuit 40 of the present embodiment, when an overcurrent has occurred in the switch element SW1, the switch element SW2 forcibly turns the switch element SW1 off using soft turn-off regardless of the state of the control signal PWM_out. Accordingly, it is possible to safely protect the switch element SW1 from the overcurrent without being restricted by the state of the control signal PWM_out.

In addition, according to the switch circuit 40 of the present embodiment, the drain terminal D of the switch element SW2 is directly connected to the gate terminal G of the switch element SW1. Since there is no extra circuit element between the switch elements SW2 and SW1, a delay is less likely to occur in the operation from detection of an overcurrent to protection against the overcurrent.

In addition, according to the switch circuit 40 of the present embodiment, since the switch element SW1 is directly turned off by the switch element SW2, the overcurrent protection does not include a multi-stage operation. Accordingly, a delay is less likely to occur in the operation from detection of an overcurrent to protection against the overcurrent.

In addition, the switch circuit 40 according to the present embodiment protects the switch element SW1 from the overcurrent, using a small and simple overcurrent protection circuit including the switch element SW2, the overcurrent detector circuit 2, and the resistor R2. Accordingly, it is possible to implement a small and low-cost switch circuit.

In addition, since the switch circuit 40 according to the present embodiment achieves the overcurrent protection using a small and simple circuit, it is possible to reduce the overall inductance of the overcurrent protection circuit and the switch circuit 40. Accordingly, even when driving a next-generation high-speed power semiconductor element including SJMOS, SiC, GaN, etc., a large driving noise is less likely to occur.

In addition, according to the switch circuit 40 of the present embodiment, when the switch element SW2 is turned off (that is, when an overcurrent has not occurred in the switch element SW1), the normal operation of the switch element SW1 is not affected by the overcurrent protection circuit, and no delay occurs due to the overcurrent protection circuit. Accordingly, a decrease in the switching speed and a loss of the switch element SW1 during the normal operation are less likely to occur.

In addition, the switch circuit 40 according to the present embodiment can be configured by externally connecting an overcurrent protection circuit to the generic driver circuit 1. Accordingly, the driver circuit 1 may not have an extra function for overcurrent protection, and it is possible to increase a degree of freedom in designing the switch circuit.

As described above, according to the switch circuit 40 of the present embodiment, it is possible to achieve overcurrent protection with a circuit smaller and simpler than that of the prior art, and with an operation simpler than that of the prior art, without affecting a normal operation.

Modified Embodiments of First Embodiment

Next, modified embodiments of the first embodiment will be described with reference to FIG. 5 to FIG. 13.

First Modified Embodiment of First Embodiment

Figure 5:
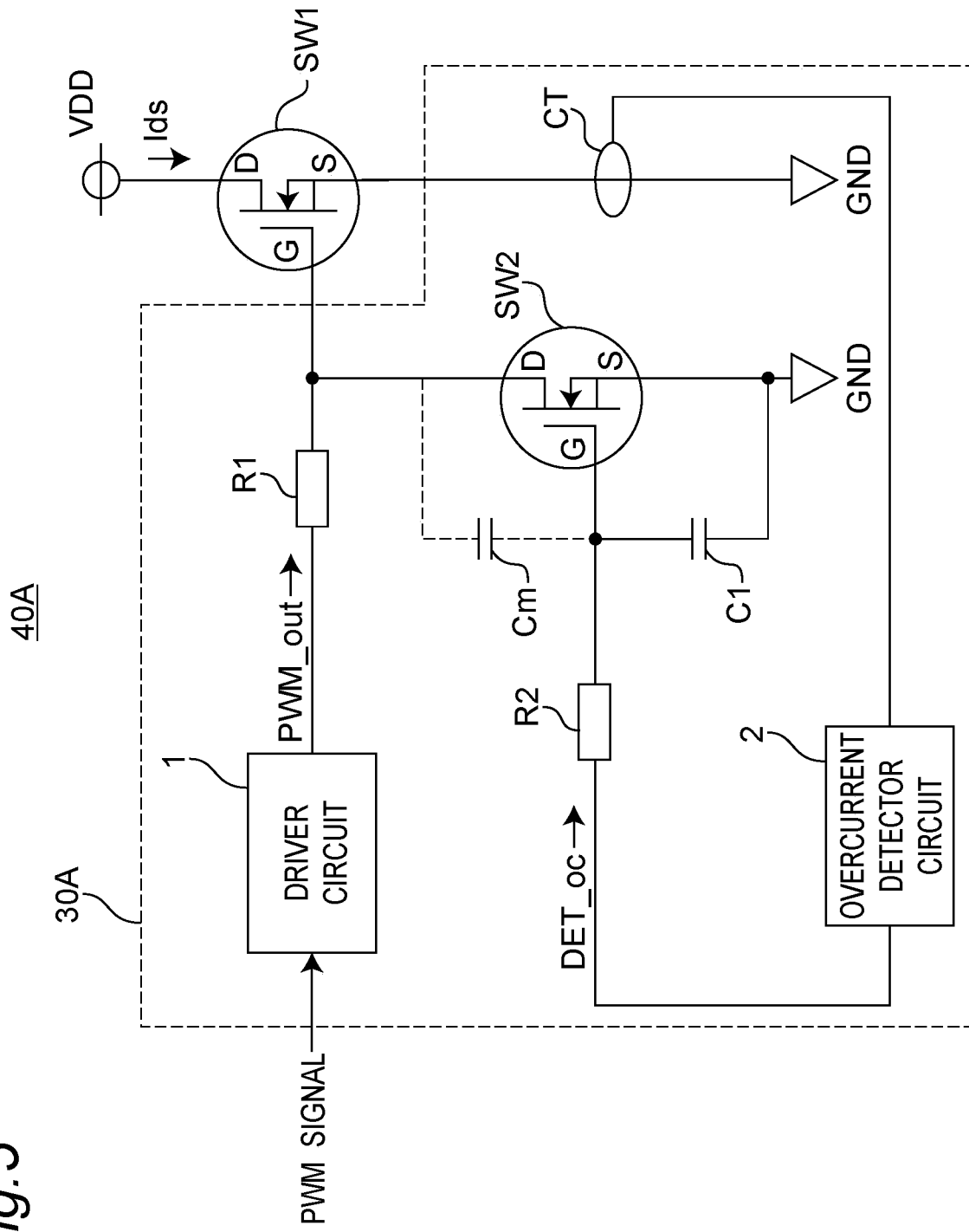
FIG. 5 is a circuit diagram schematically illustrating an exemplary configuration of a switch circuit 40A according to a first modified embodiment of the first embodiment.

FIG. 5 is a circuit diagram schematically illustrating an exemplary configuration of a switch circuit 40A according to a first modified embodiment of the first embodiment. The switch circuit 40A of FIG. 5 is provided with a control circuit 30A, instead of the control circuit 30 of FIG. 1. The control circuit 30A is provided with the components of the control circuit 30 of FIG. 1, and further provided with a capacitor C1 connected between the source terminal S and the gate terminal G of the switch element SW2.

The switch element SW2 has a mirror capacitance Cm between the drain terminal D and the gate terminal G. In the switch circuit 40 of FIG. 1, a mirror current may flow from the driver circuit 1 to the resistor R2 via a mirror capacitance Cm of the switch element SW2 during the normal operation. Accordingly, there is a problem that the gate-source voltage Vgs2 of the switch element SW2 increases, and the switch element SW2 is falsely turned on. Thus, in the switch circuit 40A in FIG. 5, the capacitor C1 is added to prevent the gate-source voltage Vgs2 from increasing due to the mirror current.

Next, effects of providing the capacitor C1 will be described with reference to FIG. 6 and FIG. 7.

Figure 6:
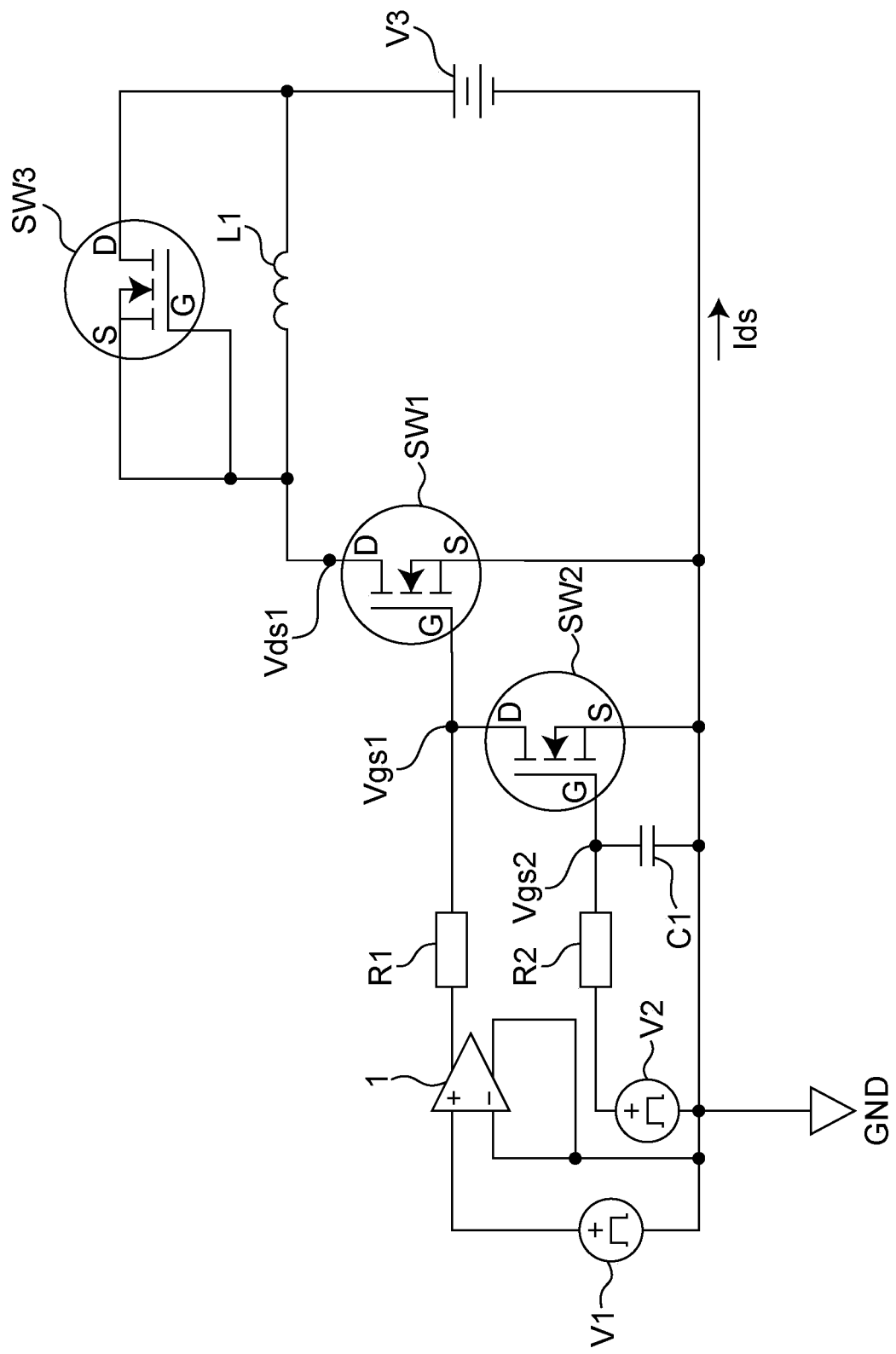
FIG. 6 is a circuit diagram schematically illustrating an exemplary configuration of the switch circuit 40A of FIG. 5 for simulation thereof.

FIG. 6 is a circuit diagram schematically illustrating an exemplary configuration of the switch circuit 40A of FIG. 5 for simulation thereof. A voltage source V1 was used as a signal source of the PWM signal. A voltage source V2 was used as a signal source of the control signal DET_oc outputted from the overcurrent detector circuit 2. A voltage source V3 of 450 V was used instead of the voltage source VDD of FIG. 5. SCT2080KE which is a MOSFET supplied by ROHM Co., Ltd. was used as the switch element SW1. RSR025N03 which is a MOSFET supplied by ROHM Co., Ltd. was used as the switch element SW2. The resistor R1 was 15Ω, and the resistor R2 was 930Ω. The capacitor C1 was 500 pF. SCT2080KE and an inductor of 50 μH were used as loads.

Figure 7:
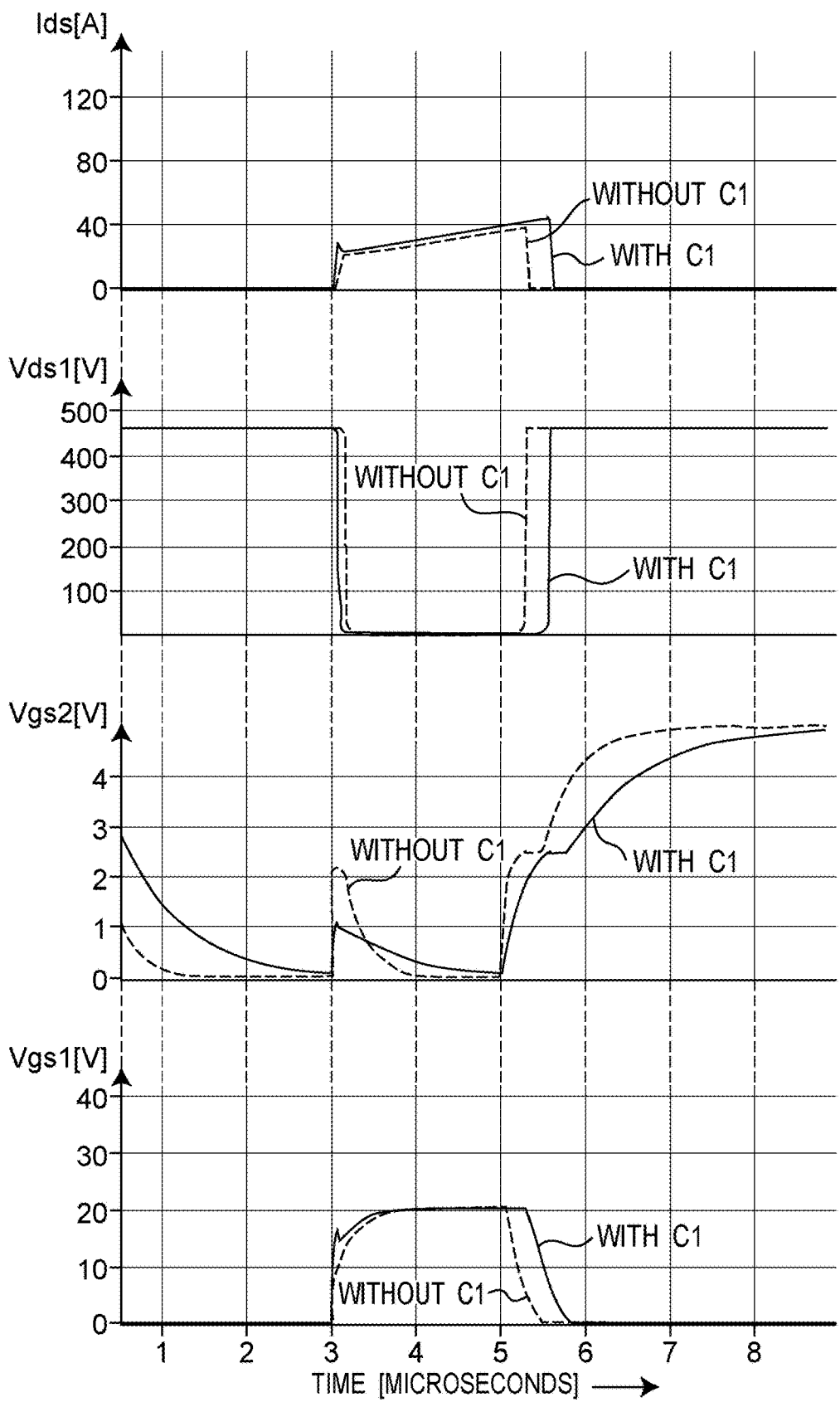
FIG. 7 is a waveform diagram schematically illustrating an exemplary operation of the switch circuit of FIG. 6.

FIG. 7 is a waveform diagram schematically illustrating an exemplary operation of the switch circuit of FIG. 6. Simulations were performed in a case where the switch circuit of FIG. 6 is provided with the capacitor C1, and in a case where the switch circuit is not provided with the capacitor C1. A first graph of FIG. 7 shows the current Ids flowing through the switch element SW1. A second graph of FIG. 7 shows the drain-source voltage Vds1 applied to the switch element SW1. A third graph of FIG. 7 shows the gate-source voltage Vgs2 applied to the switch element SW2. A fourth graph of FIG. 7 shows the gate-source voltage Vgs1 applied to the switch element SW1. According to the third graph of FIG. 7, when the switch circuit is not provided with the capacitor C1, a noise more than 2 V occurs due to the mirror current at time of 3 microseconds. Accordingly, there is a high possibility that the switch element SW2 is falsely turned on. On the other hand, when the switch circuit is provided with the capacitor C1, it can be seen that this noise is reduced by about half.

According to the switch circuit 40A of FIG. 5, since the capacitor C1 is provided, a malfunction of the switch element SW2 due to the mirror current is less likely to occur.

Second Modified Embodiment of First Embodiment

Figure 8:
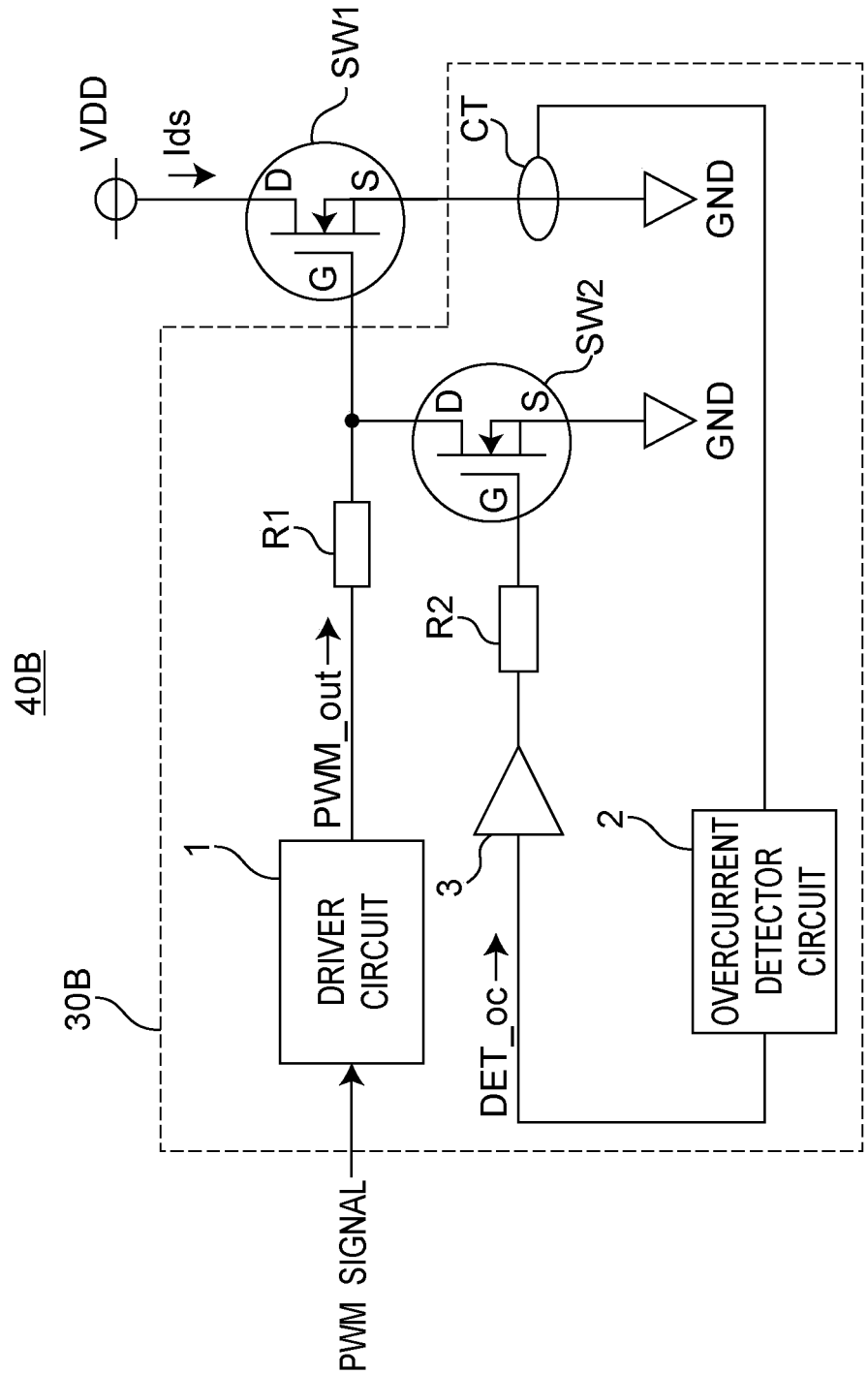
FIG. 8 is a circuit diagram schematically illustrating an exemplary configuration of a switch circuit 40B according to a second modified embodiment of the first embodiment.

FIG. 8 is a circuit diagram schematically illustrating an exemplary configuration of a switch circuit 40B according to a second modified embodiment of the first embodiment. The switch circuit 40B of FIG. 8 is provided with a control circuit 30B instead of the control circuit 30 of FIG. 1. The control circuit 30B is provided with the components of the control circuit 30 of FIG. 1, and further provided with a level shifter 3 connected between the overcurrent detector circuit 2 and the resistor R2. The level shifter 3 shifts an electric potential of the control signal DET_oc (or at least an electric potential of the control signal DET_oc at the low level) so as to have a polarity opposite to a polarity of the electric potential of the voltage source VDD (that is, negative electric potential), with respect to the electric potential of the ground GND. According to the switch circuit 40B of FIG. 8, since the gate-source voltage Vgs2 of the switch element SW2 is shifted in advance, the gate-source voltage Vgs2 is less likely to reach the gate threshold Vth2, even when the mirror current flows via the mirror capacitance of the switch element SW2. Accordingly, a malfunction of the switch element SW2 due to the mirror current is less likely to occur.

For example, assume that the control signal DET_oc is 20 V at the high level, and 0 V at the low level. The level shifter 3 may shift the electric potential of the control signal DET_oc by, for example, −2 V.

The level shifter 3 may be integrated with the overcurrent detector circuit 2. In this case, when turning the switch element SW2 off, the overcurrent detector circuit 2 generates the control signal DET_oc having a polarity opposite to a polarity of the electric potential of the voltage source VDD, with respect to the electric potential of the ground GND.

The switch circuit may be provided with both the capacitor C1 of FIG. 5 and the level shifter 3 of FIG. 8 so that a malfunction of the switch element SW2 is less likely to occur.

Third Modified Embodiment of First Embodiment

Figure 9:
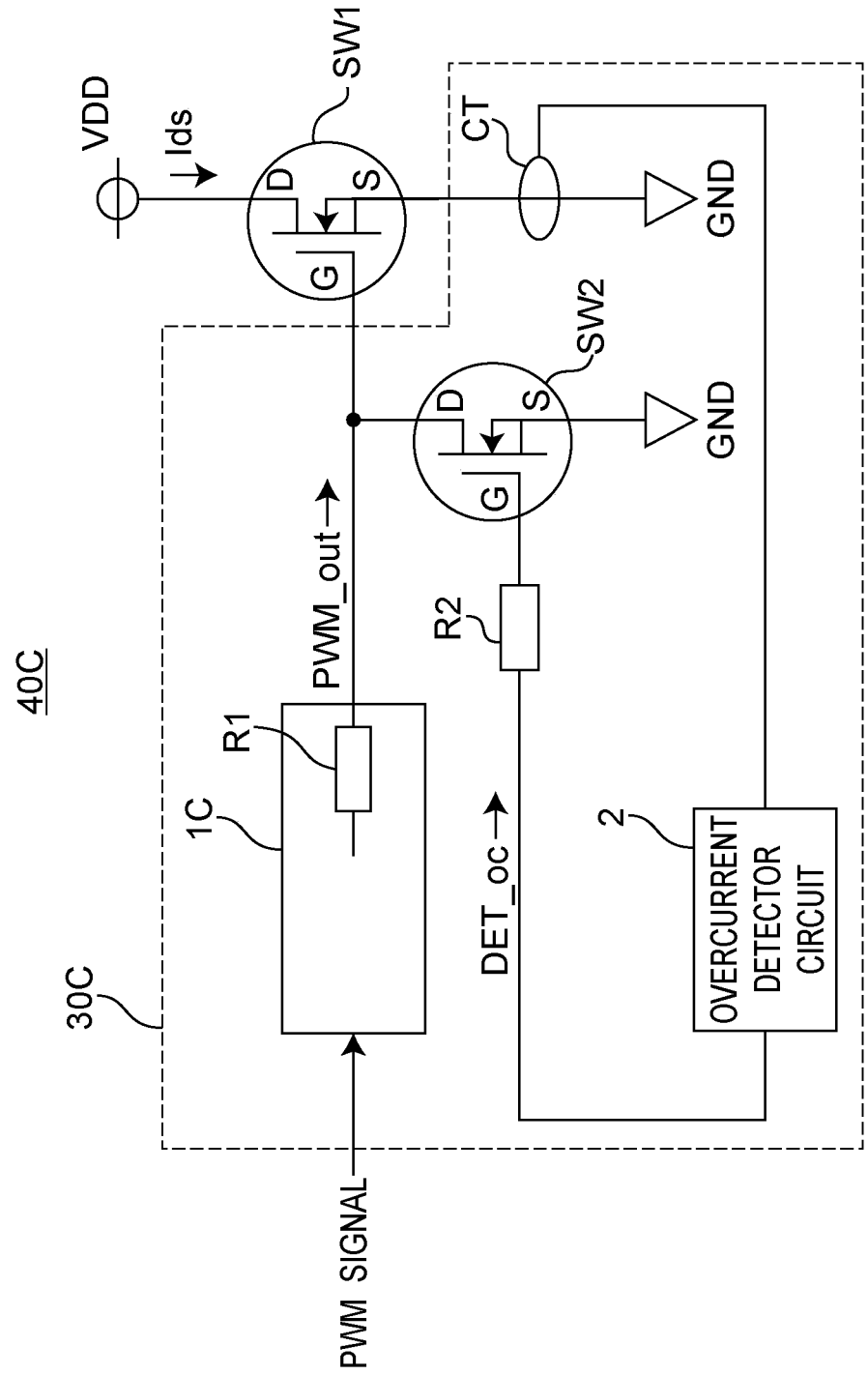
FIG. 9 is a circuit diagram schematically illustrating an exemplary configuration of a switch circuit 40C according to a third modified embodiment of the first embodiment.

FIG. 9 is a circuit diagram schematically illustrating an exemplary configuration of a switch circuit 40C according to a third modified embodiment of the first embodiment. The switch circuit 40C of FIG. 9 is provided with a control circuit 30C instead of the control circuit 30 of FIG. 1. The control circuit 30C is provided with a driver circuit 1C, instead of the driver circuit 1 and the resistor R1 of the control circuit 30 of FIG. 1. The driver circuit 1C has a resistor R1 integrated therein. Accordingly, it is possible to further reduce the size of the switch circuit and simplify the switch circuit, as compared with the cases of FIG. 1 and other drawings.

In the switch circuits of FIG. 1 and other drawings, at least one component other than the resistor R1 may be integrated, or all the components may be integrated. Accordingly, it is possible to further reduce the size of the switch circuit and simplify the switch circuit.

Fourth Modified Embodiment of First Embodiment

Figure 10:
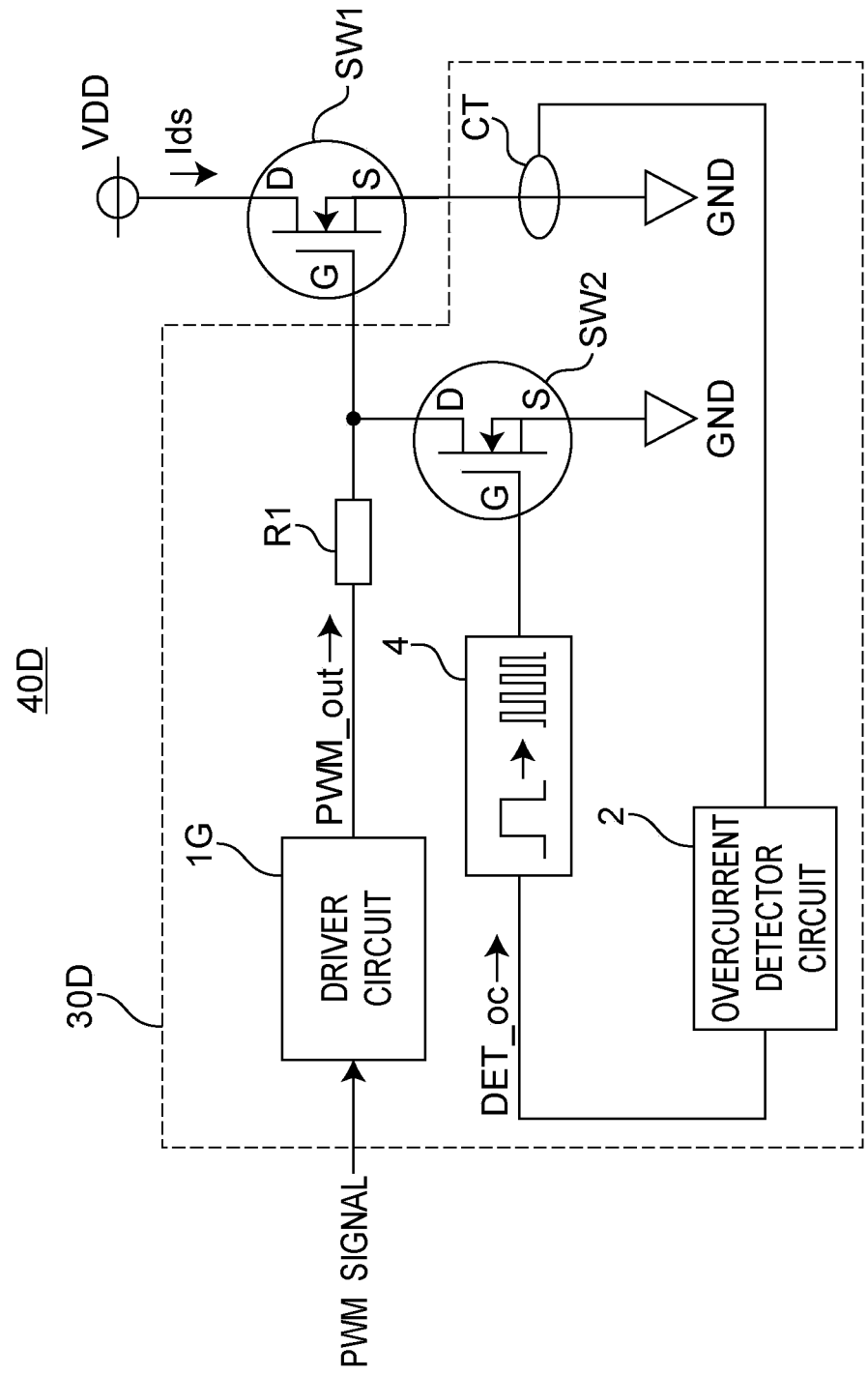
FIG. 10 is a circuit diagram schematically illustrating an exemplary configuration of a switch circuit 40D according to a fourth modified embodiment of the first embodiment.

FIG. 10 is a circuit diagram schematically illustrating an exemplary configuration of a switch circuit 40D according to a fourth modified embodiment of the first embodiment. The switch circuit 40D of FIG. 10 is provided with a control circuit 30D instead of the control circuit 30 of FIG. 1. The control circuit 30D is provided with a PWM control circuit 4 instead of the resistor R2 of FIG. 1. The PWM control circuit 4 generates a PWM signal having a duty cycle variable depending on whether the control signal DET_oc outputted from the overcurrent detector circuit 2 is at the high level or the low level, and applies the generated PWM signal to the gate terminal G of the switch element SW2. By adjusting the duty cycle of the PWM signal, it is possible to adjust an amount of charge to the gate capacitance of the switch element SW2. Accordingly, an ON time of the switch element SW2 can be adjusted. According to the switch circuit 40D of FIG. 10, the size of the circuit can be reduced by removing the resistor R2.

Fifth Modified Embodiment of First Embodiment

Figure 11:
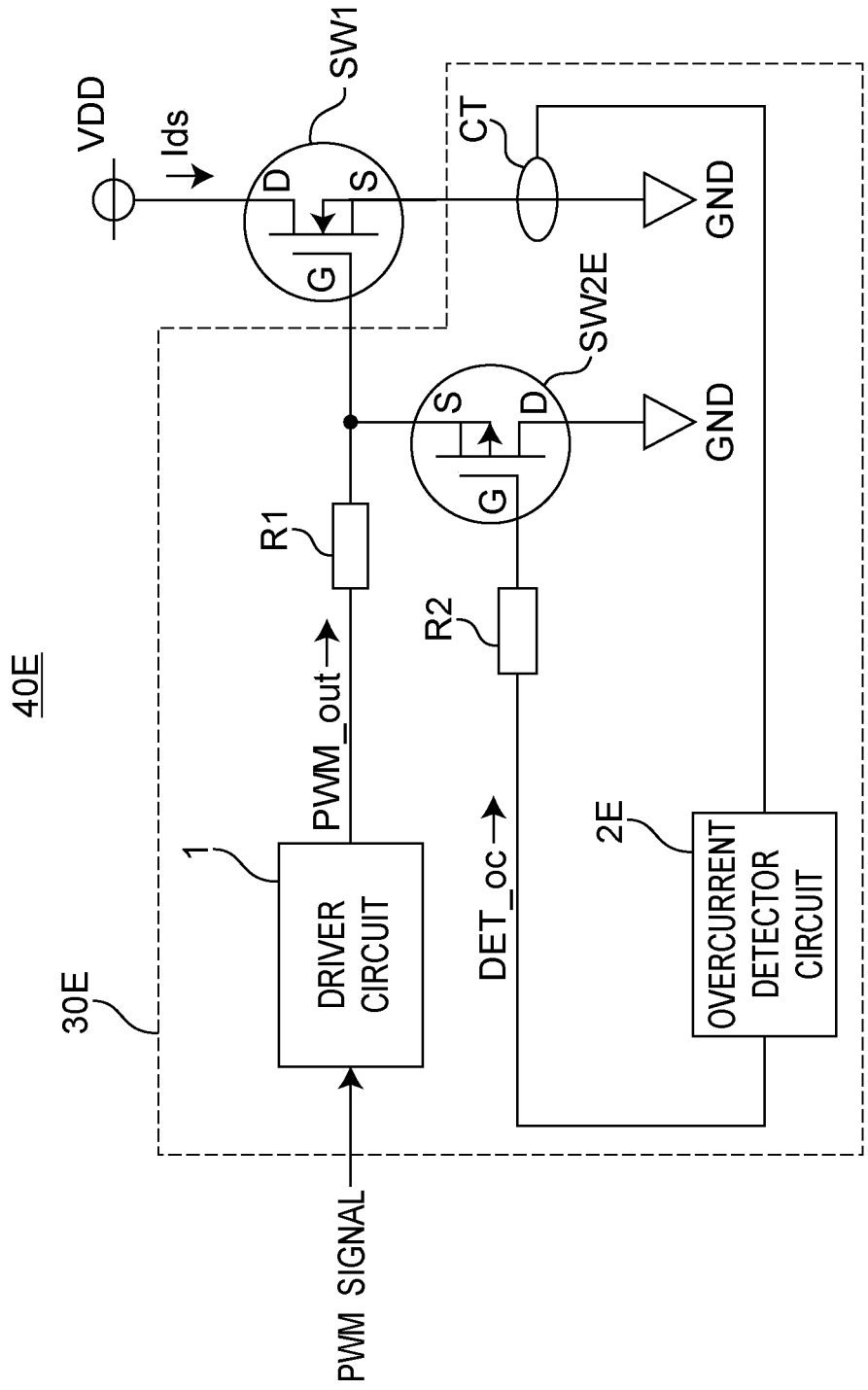
FIG. 11 is a circuit diagram schematically illustrating an exemplary configuration of a switch circuit 40E according to a fifth modified embodiment of the first embodiment.

FIG. 11 is a circuit diagram schematically illustrating an exemplary configuration of a switch circuit 40E according to a fifth modified embodiment of the first embodiment. The switch circuit 40E of FIG. 11 is provided with a control circuit 30E instead of the control circuit 30 of FIG. 1. The control circuit 30E is provided with a switch element SW2E and an overcurrent detector circuit 2E, instead of the switch element SW2 and the overcurrent detector circuit 2 of FIG. 1.

The switch element SW2E is a source terminal S connected to the gate terminal G of the switch element SW1, a drain terminal D connected to a terminal having the same electric potential as the electric potential of the source terminal S of the switch element SW1 (in the example of FIG. 11, the ground GND), and a gate terminal G. The switch element SW2E is a P-channel MOSFET.

The switch element SW2E is, herein, also referred to as the "second switch element". In addition, herein, the source terminal S of the switch element SW2E is also referred to as the "fourth terminal", the drain terminal D thereof is also referred to as the "fifth terminal", and the gate terminal G thereof is also referred to as the "sixth terminal". The switch element SW2E which is the P-channel MOSFET is an example of the "second switch element".

The overcurrent detector circuit 2E generates a control signal DET_oc for turning the switch element SW2E on and off. In a case where the switch element SW2E is the P-channel MOSFET as described above, the overcurrent detector circuit 2E sets the control signal DET_oc to a low level when the current flowing through the switch element SW1 exceeds the threshold Ith, and sets the control signal DET_oc to a high level when the current flowing through the element SW1 is equal to or smaller than the threshold Ith.

In other respects, the switch circuit 40E of FIG. 11 is configured and operates in a manner similar to that of the switch circuit 40 of FIG. 1.

Switch elements with various specifications (N-channel type or P-channel type) are available, and overcurrent detector circuits with various specifications (the control signal to be outputted upon detection of an overcurrent is set to the high level or the low level) are available. According to the switch circuits of FIG. 1 and other drawings, the overcurrent detector circuit can be appropriately selected according to the specifications of the second switch element. In addition, according to the switch circuits of FIG. 1 and other drawings, the switch elements can be appropriately selected according to the specifications of the overcurrent detector circuit.

Even when the second switch element is the P-channel MOSFET, it is possible to achieve overcurrent protection with a circuit smaller and simpler than that of the prior art, and with an operation simpler than that of the prior art, without affecting a normal operation, in a manner similar to that of the switch circuits of FIG. 1 and other drawings.

The switch circuit may be further provided with a logic inverter between the overcurrent detector circuit and the second switch element, in order to invert a logical value of the second control signal DET_oc according to the specification of the second switch element.

Sixth Modified Embodiment of First Embodiment

Figure 12:
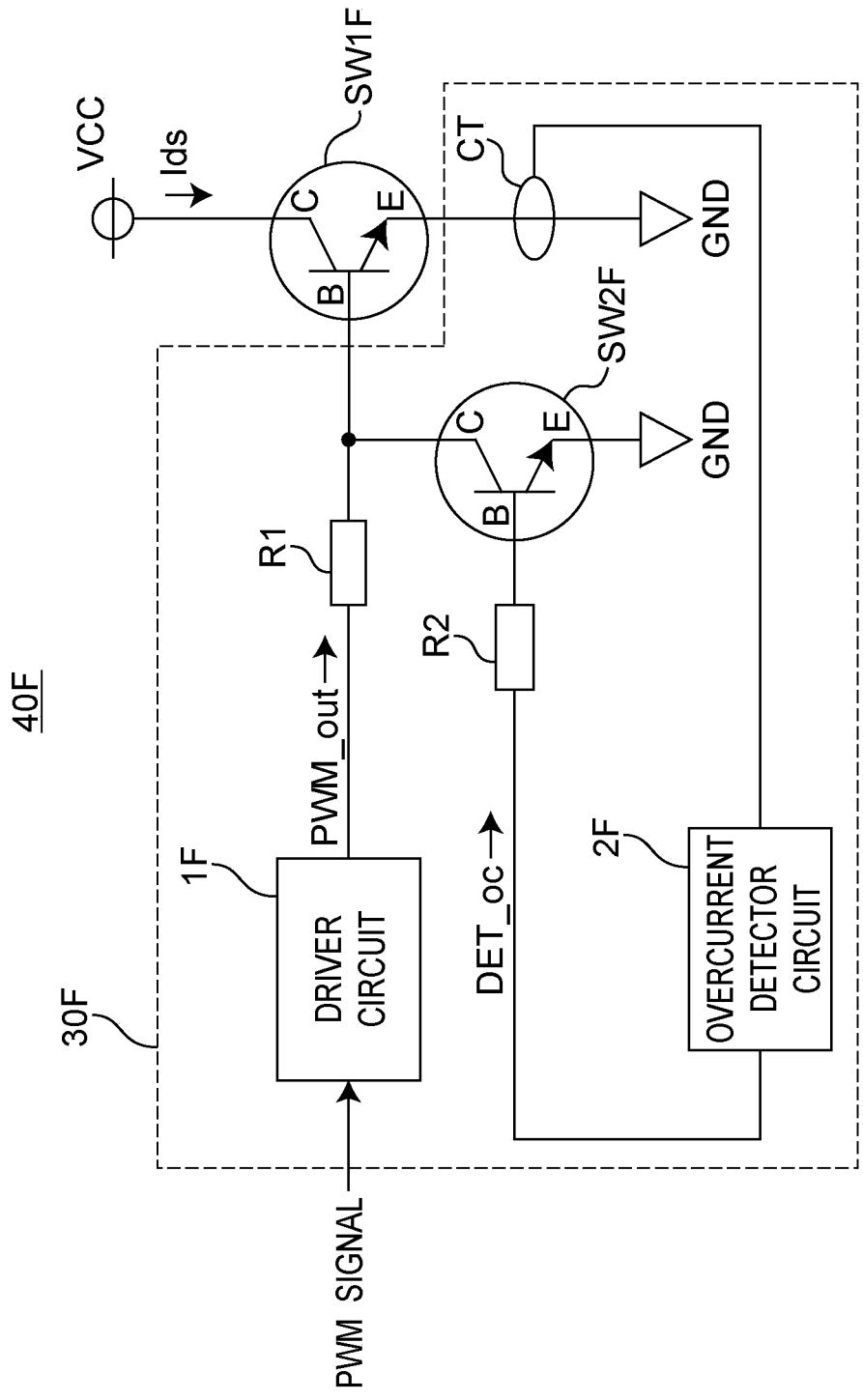
FIG. 12 is a circuit diagram schematically illustrating an exemplary configuration of a switch circuit 40F according to a sixth modified embodiment of the first embodiment.

FIG. 12 is a circuit diagram schematically illustrating an exemplary configuration of a switch circuit 40F according to a sixth modified embodiment of the first embodiment. The switch circuit 40F of FIG. 12 is provided with a switch element SW1F, a driver circuit 1F, a resistor R1, a switch element SW2F, an overcurrent detector circuit 2F, and a resistor R2. The switch element SW2F, the overcurrent detector circuit 2F, and the resistor R2 constitute an overcurrent protection circuit for the switch element SW1F, the overcurrent protection circuit detecting an overcurrent in the switch element SW1F, and protecting the switch element SW1F from the overcurrent. In addition, the driver circuit 1F, the resistor R1, the switch element SW2F, the overcurrent detector circuit 2F, and the resistor R2 constitute a control circuit 30F for the switch element SW1F, the control circuit 30F turning the switch element SW1F on and off, detecting an overcurrent in the switch element SW1F, and protect the switch element SW1F from the overcurrent.

The switch element SW1F has a collector terminal C connected to a voltage source VCC, an emitter terminal E connected to a ground GND, and a base terminal B. The switch element SW1F is an NPN transistor. An electric potential of the voltage source VCC is higher than an electric potential of the ground GND.

The switch element SW1F is, herein, also referred to as the "first switch element". In addition, herein, the collector terminal C of the switch element SW1F is also referred to as the "first terminal", the emitter terminal E thereof is also referred to as the "second terminal", and the base terminal B thereof is also referred to as the "third terminal". In addition, herein, the voltage source VCC is also referred to as the "first voltage source", and the ground GND is also referred to as the "second voltage source". The voltage source VCC and the ground GND are examples of the "first voltage source" and the "second voltage source", respectively. In addition, the switch element SW1F which is the NPN transistor is an example of the "first switch element".

The driver circuit 1F generates a control signal PWM_out for turning the switch element SW1F on and off with a certain duty cycle. When the switch element SW1F is the NPN transistor as described above, the control signal PWM_out becomes a high level when turning the switch element SW1F on, and the control signal PWM_out becomes a low level when turning the switch element SW1F off.

The resistor R1 is connected between the driver circuit 1F and the base terminal B of the switch element SW1F.

The switch element SW2F has a collector terminal C connected to the base terminal B of the switch element SW1F, an emitter terminal E connected to a terminal having the same electric potential as the electric potential of the emitter terminal E of the switch element SW1F (in the example of FIG. 12, the ground GND), and a base terminal B. The switch element SW2F is an NPN transistor.

The switch element SW2F is, herein, also referred to as the "second switch element". In addition, herein, the collector terminal C of the switch element SW2F is also referred to as the "fourth terminal", the emitter terminal E thereof is also referred to as the "fifth terminal", and the base terminal B thereof is also referred to as the "sixth terminal". The switch element SW2F which is the NPN transistor is an example of the "second switch element".

The overcurrent detector circuit 2F generates a control signal DET_oc for turning the switch element SW2F on and off. When the switch element SW2F is the NPN transistor as described above, the overcurrent detector circuit 2F sets the control signal DET_oc to a high level when the current flowing through the switch element SW1F exceeds the threshold Ith, and sets the control signal DET_oc to a low level when the current flowing through the switch element SW1F is equal to or smaller than the threshold Ith.

The resistor R2 is connected between the overcurrent detector circuit 2F and the base terminal B of the switch element SW2F.

In other respects, the switch circuit 40F of FIG. 12 is configured and operates in a manner similar to that of the switch circuit 40 of FIG. 1.

Even when the second switch element is the NPN transistor, it is possible to achieve overcurrent protection with a circuit smaller and simpler than that of the prior art, and with an operation simpler than that of the prior art, without affecting a normal operation, in a manner similar to that of the switch circuits of FIG. 1 and other drawings provided with the N-channel or P-channel MOSFET.

Seventh Modified Embodiment of First Embodiment

Figure 13:
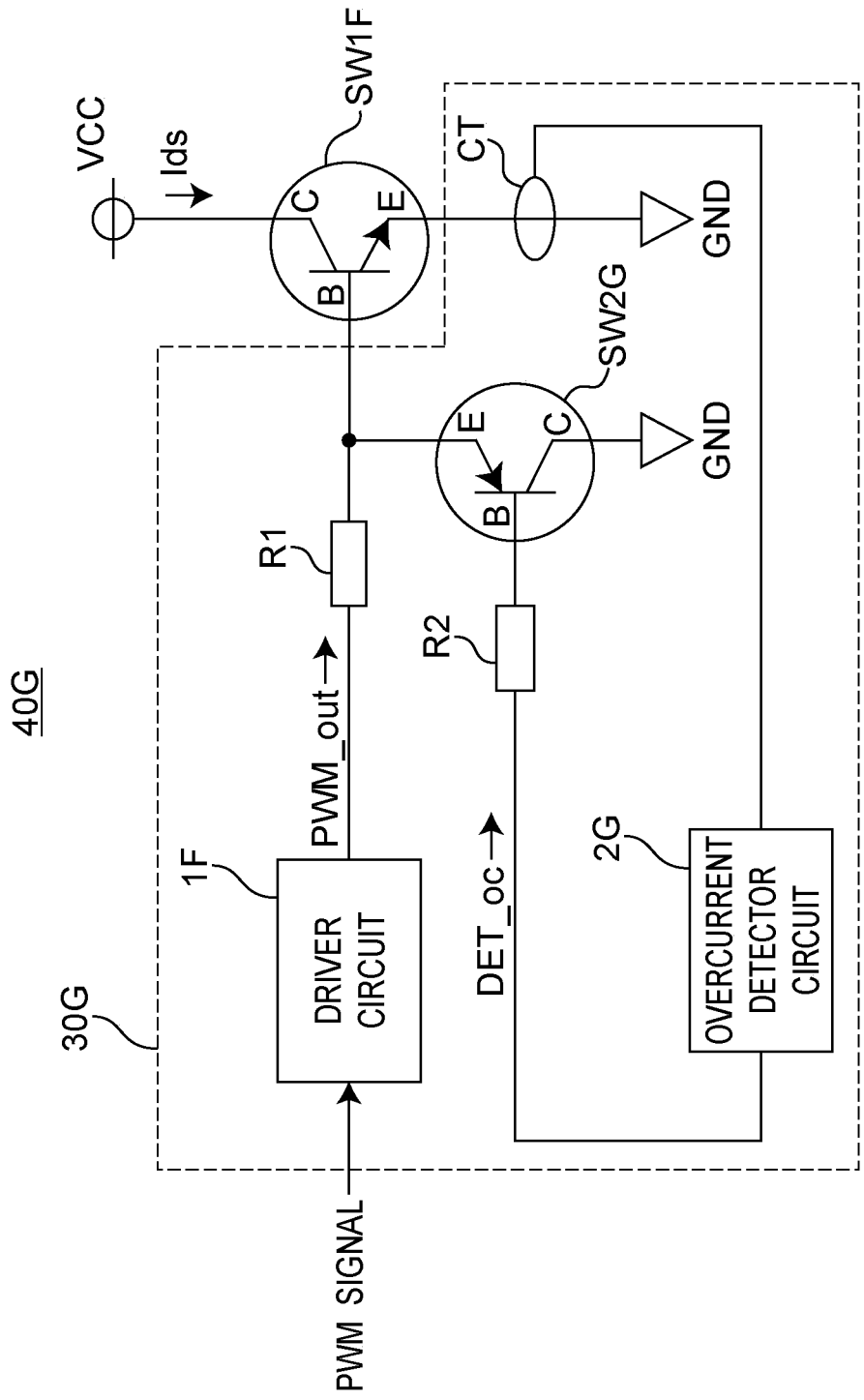
FIG. 13 is a circuit diagram schematically illustrating an exemplary configuration of a switch circuit 40G according to a seventh modified embodiment of the first embodiment.

FIG. 13 is a circuit diagram schematically illustrating an exemplary configuration of a switch circuit 40G according to a seventh modified embodiment of the first embodiment. The switch circuit 40G of FIG. 13 is provided with a control circuit 30G instead of the control circuit 30F of FIG. 12. The control circuit 30G is provided with a switch element SW2G and an overcurrent detector circuit 2G, instead of the switch element SW2F and the overcurrent detector circuit 2F of FIG. 12.

The switch element SW2G has an emitter terminal E connected to the base terminal B of the switch element SW1F, a collector terminal C connected to a terminal having the same electric potential as the electric potential of the emitter terminal E of the switch element SW1F (in the example of FIG. 13, the ground GND), and a base terminal B. The switch element SW2G is a PNP transistor.

The switch element SW2G is, herein, also referred to as the "second switch element". In addition, herein, the emitter terminal E of the switch element SW2G is also referred to as the "fourth terminal", the collector terminal C thereof is also referred to as the "fifth terminal", and the base terminal B thereof is also referred to as the "sixth terminal". The switch element SW2G which is the PNP transistor is an example of the "second switch element".

The overcurrent detector circuit 2G generates a control signal DET_oc for turning the switch element SW2G on and off. When the switch element SW2G is the PNP transistor as described above, the overcurrent detector circuit 2G sets the control signal DET_oc to the low level when the current flowing through the switch element SW1F exceeds the threshold Ith, and sets the control signal DET_oc to the high level when the current flowing through the switch element SW1F is equal to or smaller than the threshold Ith.

In other respects, the switch circuit 40G of FIG. 13 is configured and operates in a manner similar to that of the switch circuit 40F of FIG. 12.

Even when the second switch element is the PNP transistor, it is possible to achieve overcurrent protection with a circuit smaller and simpler than that of the prior art, and with an operation simpler than that of the prior art, without affecting a normal operation, in a manner similar to that of the switch circuits of FIG. 1 and other drawings.

The first switch circuit which is the N-channel MOSFET may be combined with the second switch circuit which is the NPN or PNP transistor. In addition, the first switch circuit which is the NPN transistor may be combined with the second switch circuit which is the N-channel or P-channel MOSFET.

Second Embodiment

Power converter apparatuses according to a second embodiment will be described with reference to FIG. 14 to FIG. 17.

Exemplary Configuration of Second Embodiment

Figure 14:
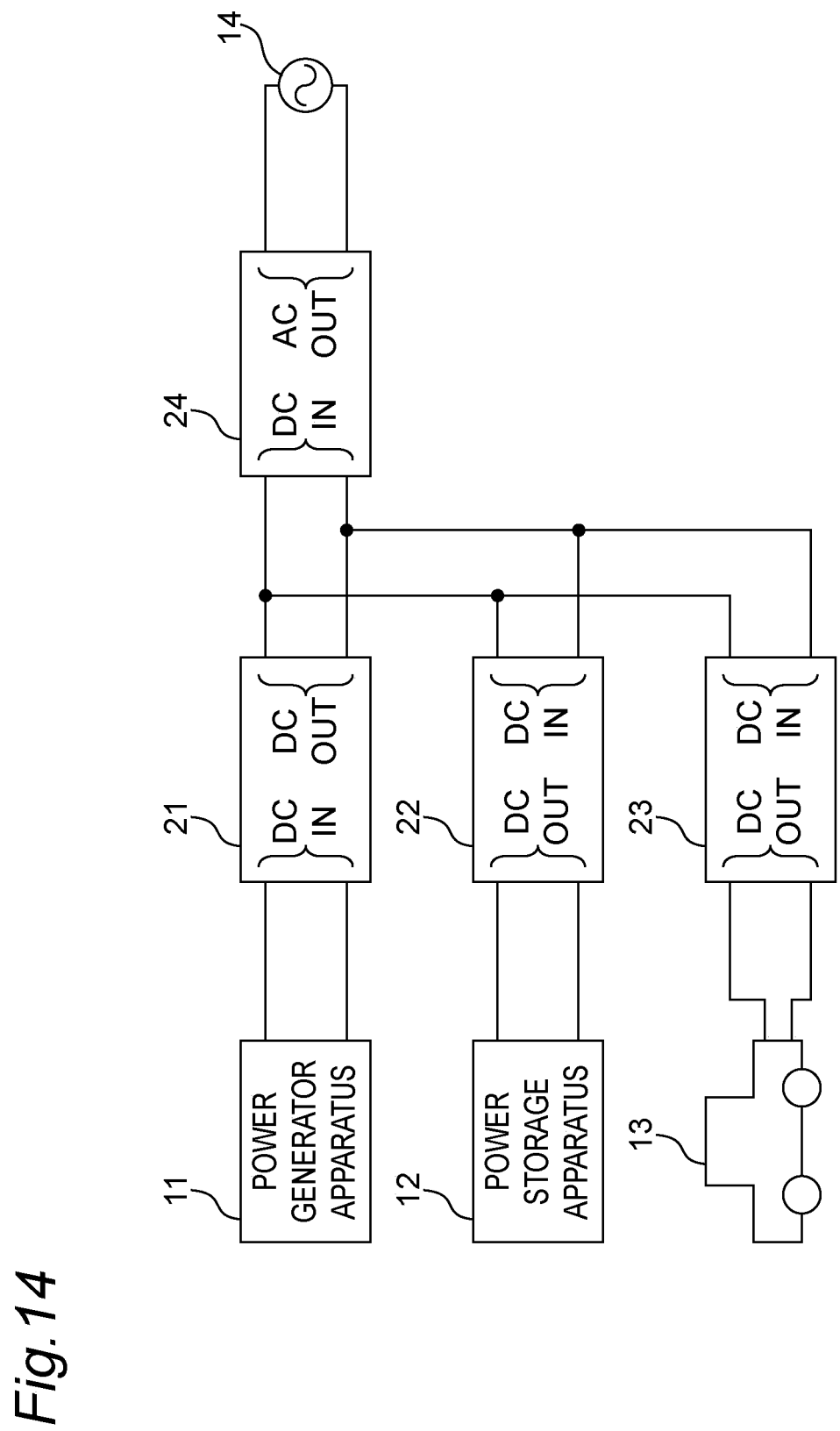
FIG. 14 is a block diagram schematically illustrating an exemplary configuration of a power system according to a second embodiment.

FIG. 14 is a block diagram schematically illustrating an exemplary configuration of a power system according to the second embodiment. The power system of FIG. 14 is provided with a power generator apparatus 11, a power storage apparatus 12, an electric vehicle 13, a commercial power system 14, and power converter apparatuses 21 to 24.

The power generator apparatus 11 generates a DC power, and sends the DC power to the power converter apparatus 21. The power generator apparatus 11 is, for example, a solar cell, but is not limited thereto.

The power converter apparatus 21 converts inputted DC power at a certain voltage, into DC power at a higher voltage for output. In the example of FIG. 14, the power converter apparatus 21 sends the converted DC power to the power converter apparatuses 22 to 24.

Each of the power converter apparatuses 22 and 23 converts inputted DC power at a certain voltage, into DC power at a lower voltage for output. In the example of FIG. 14, the power converter apparatuses 22 and 23 send the converted DC power to the power storage apparatus 12 and the electric vehicle 13, respectively.

The power storage apparatus 12 stores inputted power. The electric vehicle 13 stores inputted power in an internal battery.

The power converter apparatus 24 converts inputted DC power into AC power for output. The power converter apparatus 24 sends the converted AC power to the commercial power system 14.

Figure 15:
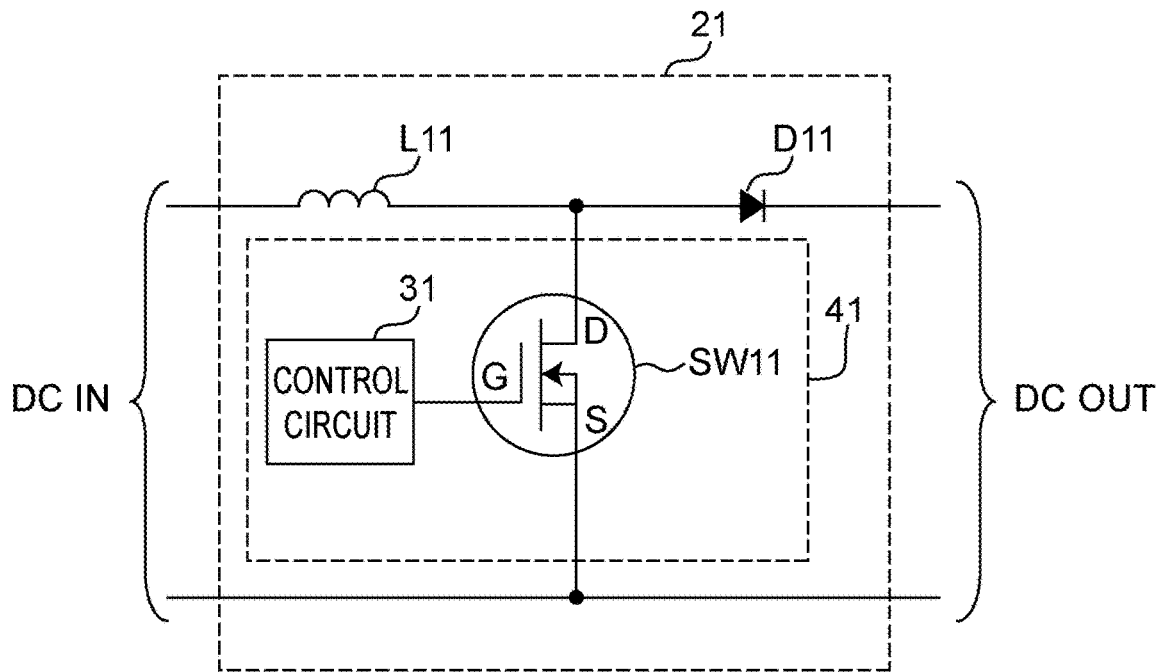
FIG. 15 is a block diagram schematically illustrating an exemplary configuration of a power converter apparatus 21 of FIG. 14.

FIG. 15 is a block diagram schematically illustrating an exemplary configuration of the power converter apparatus 21 of FIG. 14. The power converter apparatus 21 is provided with a switch circuit 41, an inductor L11, and a diode D1. The switch circuit 41 is provided with a switch element SW11 and a control circuit 31. The switch element SW11 corresponds to the first switch element of FIG. 1 and other drawings. The control circuit 31 is provided with components corresponding to the components other than the first switch element of FIG. 1 and other drawings. In the control circuit 31, the source terminal (or the emitter terminal) of the second switch element is connected to the source terminal S of the switch element SW11. The control circuit 31 turns the switch element SW11 on and off, detects an overcurrent in the switch element SW11, and protects the switch element SW11 from the overcurrent, in a manner similar to that of the control circuit for the first switch element of FIG. 1 and other drawings.

Figure 16:
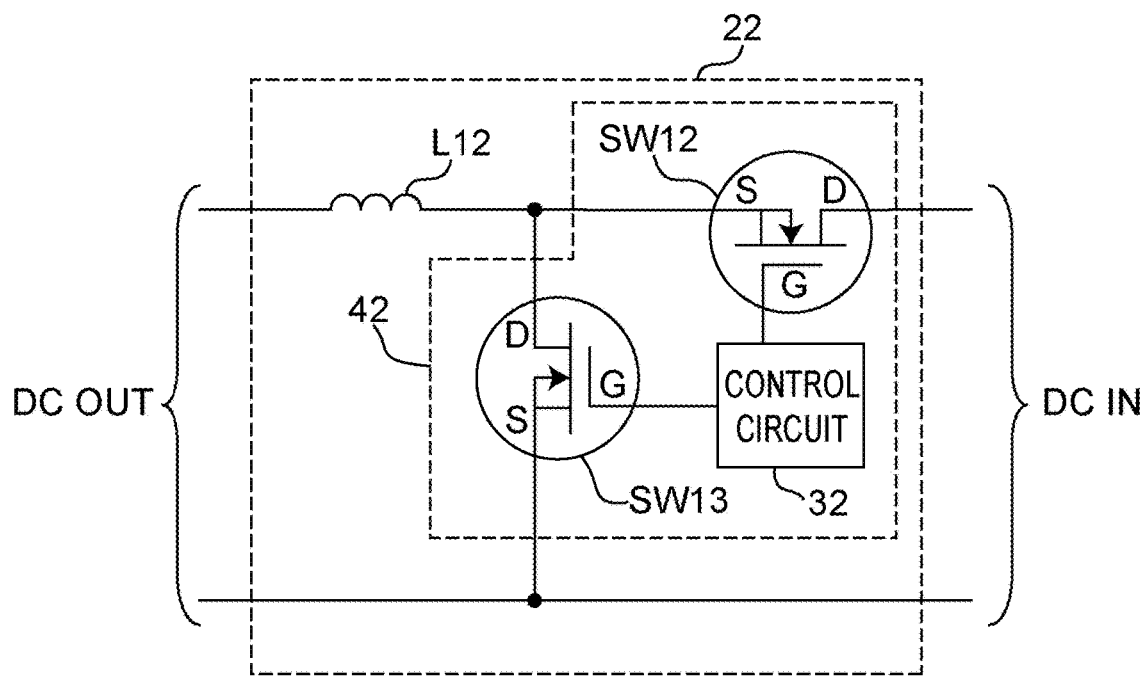
FIG. 16 is a block diagram schematically illustrating an exemplary configuration of a power converter apparatus 22 of FIG. 14.

FIG. 16 is a block diagram schematically illustrating an exemplary configuration of the power converter apparatus 22 of FIG. 14. The power converter apparatus 22 is provided with a switch circuit 42 and an inductor L12. The switch circuit 42 is provided with switch elements SW12 and SW13, and a control circuit 32. Each of the switch elements SW12 and SW13 corresponds to the first switch element of FIG. 1 and other drawings. The control circuit 32 is provided with components corresponding to the components other than the first switch element of FIG. 1 and other drawings, for each of the switch elements SW12 and SW13. In the control circuit 32, the source terminal (or the emitter terminal) of the second switch element for the switch element SW12 is connected to the source terminal S of the switch element SW12. In addition, in the control circuit 32, the source terminal (or the emitter terminal) of the second switch element for the switch element SW13 is connected to the source terminal S of the switch element SW13. The control circuit 32 turns the switch element SW12 on and off, detects an overcurrent in the switch element SW12, protects the switch element SW12 from the overcurrent, and further turns the switch element SW13 on and off, detects an overcurrent in the switch element SW13, and protects the switch element SW13 from the overcurrent, in a manner similar to that of the control circuit for the first switch element of FIG. 1 and other drawings.

The power converter apparatus 23 of FIG. 14 is also configured in a manner similar to that of the power converter apparatus 22 of FIG. 16.

Figure 17:
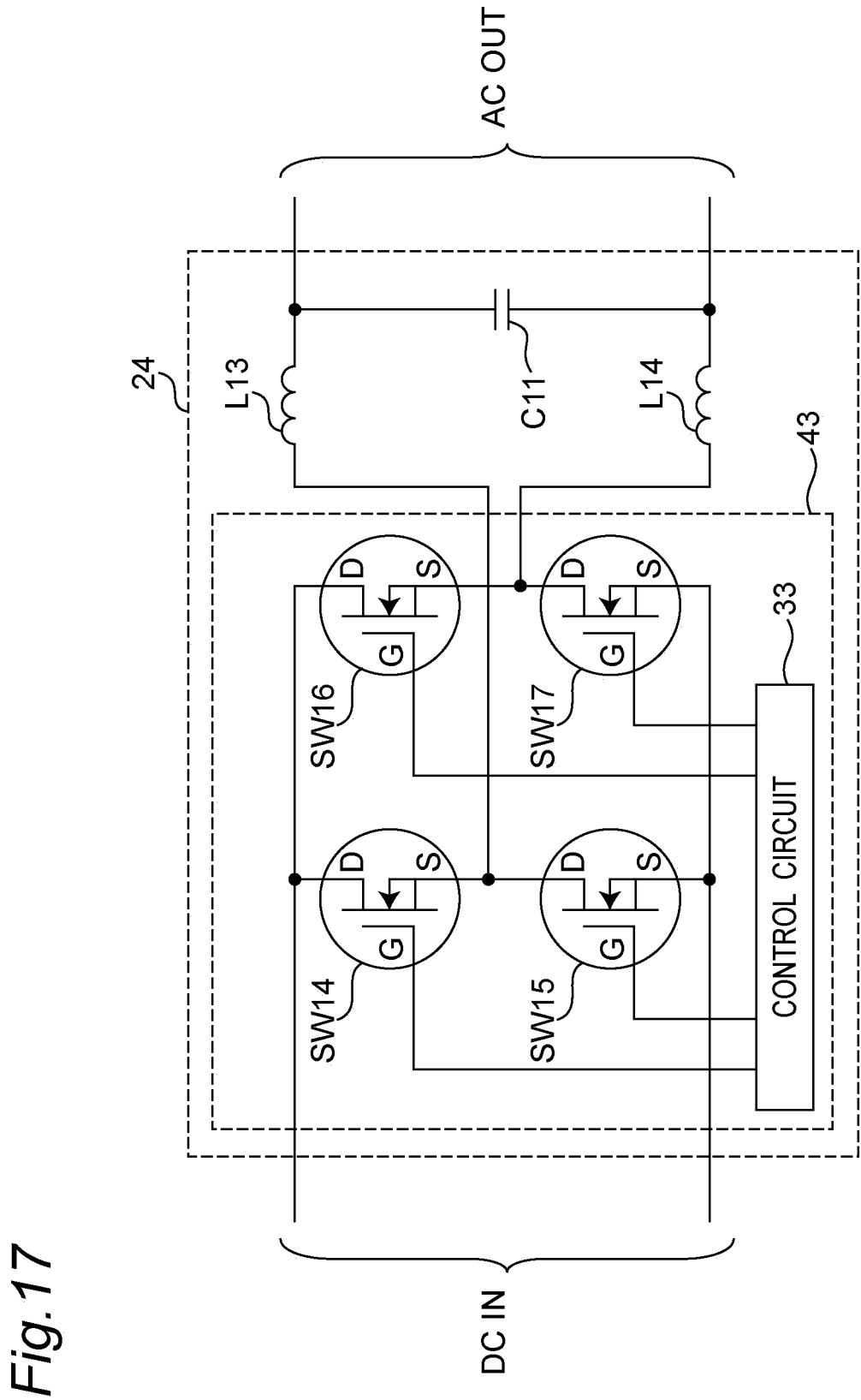
FIG. 17 is a block diagram schematically illustrating an exemplary configuration of a power converter apparatus 24 of FIG. 14.

FIG. 17 is a block diagram schematically illustrating an exemplary configuration of the power converter apparatus 24 of FIG. 14. The power converter apparatus 24 is provided with a switch circuit 43, inductors L13 and L14, and a capacitor C11. The switch circuit 43 is provided with switch elements SW14 to SW17 and a control circuit 33. Each of the switch elements SW14 to SW17 corresponds to the first switch element of FIG. 1 and other drawings. The control circuit 33 is provided with components corresponding to the components other than the first switch element of FIG. 1 and other drawings, for each of the switch elements SW14 to SW17. In the control circuit 33, the source terminal (or the emitter terminal) of the second switch element for the switch element SW14 is connected to the source terminal S of the switch element SW14. In addition, in the control circuit 33, the source terminal (or the emitter terminal) of the second switch element for the switch element SW15 is connected to the source terminal S of the switch element SW15. In addition, in the control circuit 33, the source terminal (or the emitter terminal) of the second switch element for the switch element SW16 is connected to the source terminal S of the switch element SW16. In addition, in the control circuit 33, the source terminal (or the emitter terminal) of the second switch element for the switch element SW17 is connected to the source terminal S of the switch element SW17. The control circuit 33 turns the switch element SW14 on and off, detects an overcurrent in the switch element SW14, protects the switch element SW14 from the overcurrent, turns the switch element SW15 on and off, detects an overcurrent in the switch element SW15, protects the switch element SW15 from the overcurrent, turns the switch element SW16 on and off, detects an overcurrent in the switch element SW16, protects the switch element SW16 from the overcurrent, turns the switch element SW17 on and off, detects an overcurrent in the switch element SW17, and protects the switch element SW17 from the overcurrent, in a manner similar to that of the control circuit for the first switch element of FIG. 1 and other drawings.

The power converter apparatus 24 may be further provided with a transformer for changing a voltage of the converted AC power.

According to the power converter apparatuses 21 to 24 of FIG. 14, since the control circuits 31 to 33 are provided, it is possible to achieve overcurrent protection with a circuit smaller and simpler than that in the prior art, and with an operation simpler than that in the prior art, without affecting a normal operation.

Although the switch elements SW11 to SW17 are shown as the N-channel MOSFETs in FIG. 15 to FIG. 17, the switch elements SW11 to SW17 may be the NPN transistors.

Other Modified Embodiments

Although the embodiments of the present disclosure have been described in detail above, the above descriptions are merely examples of the present disclosure in all respects. Needless to say, various improvements and modifications can be made without departing from the scope of the present disclosure. For example, the following changes can be made. Hereinafter, components similar to those of the above embodiments are indicated by similar reference signs, and points similar to those of the above embodiments will be omitted as appropriate.

The above-described embodiments and modified embodiments may be combined in any combination.

The embodiments described herein are merely examples of the present disclosure in all respects. Needless to say, various improvements and modifications can be made without departing from the scope of the present disclosure. That is, specific configurations corresponding to the embodiments may be appropriately adopted in implementing the present disclosure.

Summary of Embodiments

The switch circuit and the power converter apparatus according to each aspect of the present disclosure may be expressed as follows.

A switch circuit (40, 40A to 40G, 41 to 43) according to a first aspect of the present disclosure is provided with: a first switch element (SW1, SW1F), a first resistor (R1), a driver circuit (1, 1C, 1F), a second switch element (SW2, SW2E to SW2G), an overcurrent detector circuit (2, 2E to 2G), and a second resistor (R2). The first switch element (SW1, SW1F) has a first terminal connected to a first voltage source (VDD, VCC), a second terminal connected to a second voltage source (GND), and a third terminal. The driver circuit (1, 1C, 1F) that generates a first control signal for turning the first switch element (SW1, SW1F) on and off. The first resistor (R1) is connected between the driver circuit (1, 1C, 1F) and the third terminal. The second switch element (SW2, SW2E to SW2G) has a fourth terminal connected to the third terminal, a fifth terminal connected to the second voltage source (GND), and a sixth terminal. The overcurrent detector circuit (2, 2E to 2G) generates a second control signal for turning the second switch element (SW2, SW2E to SW2G) on and off, based on whether or not a current flowing through the first switch element (SW1, SW1F) exceeds a predetermined threshold. The second resistor (R2) is connected between the overcurrent detector circuit (2, 2E to 2G) and the sixth terminal. The first and second resistors (R1, R2) have resistances set such that a turn-off time of the first switch element (SW1, SW1F) when the second switch element (SW2, SW2E to SW2G) is turned on by the second control signal is longer than a turn-off time of the first switch element (SW1, SW1F) when the first switch element (SW1, SW1F) is turned off by the first control signal.

A switch circuit (40A) according to a second aspect of the present disclosure is configured in a manner similar to that of the switch circuit according to the first aspect, and the switch circuit (40A) is further provided with a capacitor (C1) that is connected between the fifth and sixth terminals of the second switch element (SW2).

A switch circuit (40B) according to a third aspect of the present disclosure is configured in a manner similar to that of the switch circuit according to the first or second aspect, and in the switch circuit (40B), when turning the second switch element (SW2) off, the overcurrent detector circuit (2, 3) generates the second control signal having a polarity opposite to a polarity of an electric potential of the first voltage source (VDD), with respect to an electric potential of the second voltage source (GND).

A switch circuit (40C) according to a fourth aspect of the present disclosure is configured in a manner similar to that of the switch circuit according to any one of the first to third aspects, and the first resistor (R1) is integrated with the driver circuit (1C).

A switch circuit (40, 40F) according to a fifth aspect of the present disclosure is configured in a manner similar to that of the switch circuit according to any one of the first to fourth aspects, and in the switch circuit (40, 40F), the second switch element (SW2, SW2F) is an NPN transistor or an N-channel MOSFET. The overcurrent detector circuit (2, 2F) sets the second control signal to a high level when the current flowing through the first switch element (SW1, SW1F) exceeds the threshold, and sets the second control signal to a low level when the current flowing through the first switch element (SW1, SW1F) is equal to or smaller than the threshold.

A switch circuit (40E, 40G) according to a sixth aspect of the present disclosure is configured in a manner similar to that of the switch circuit according to any one of the first to fourth aspects, and in the switch circuit (40E, 40G), the second switch element (SW2E, SW2G) is a PNP transistor or a P-channel MOSFET. The overcurrent detector circuit (2E, 2G) sets the second control signal to a low level when the current flowing through the first switch element (SW1F) exceeds the threshold, and sets the second control signal to a high level when the current flowing through the first switch element (SW1F) is equal to or smaller than the threshold.

A power converter apparatus according to a seventh aspect of the present disclosure is provided with at least one of the switch circuit (40, 40A to 40G, 41 to 43) according to any one of the first to sixth aspects.

INDUSTRIAL APPLICABILITY

The switch circuit according to each aspect of the present disclosure is applicable to, for example, overcurrent protection of switch elements in a power converter apparatus.

The switch circuit according to each aspect of the present disclosure is applicable not only to the power converter apparatus, but also to any device requiring overcurrent protection.

The invention claimed is:

1. A switch circuit comprising:
   a first switch element that has a first terminal connected to a first voltage source, a second terminal connected to a second voltage source, and a third terminal;
   a driver circuit that generates a first control signal for turning the first switch element on and off;
   a resistor that is connected between the driver circuit and the third terminal;
   a second switch element that has a fourth terminal connected to the third terminal, a fifth terminal connected to the second voltage source, and a sixth terminal;
   an overcurrent detector circuit that generates a second control signal based on whether or not a current flowing through the first switch element exceeds a predetermined threshold; and
   a PWM control circuit that is connected between the overcurrent detector circuit and the sixth terminal, and generates a PWM signal for turning the second switch element on and off, the PWM signal having a variable duty cycle depending on the second control signal, wherein the duty cycle of the PWM signal is adjusted so as to adjust an ON time of the second switch element.

2. The switch circuit as claimed in claim 1, further comprising a capacitor that is connected between the fifth and sixth terminals of the second switch element.

3. The switch circuit as claimed in claim 1,
   wherein, when turning the second switch element off, the overcurrent detector circuit generates the second control signal having a polarity opposite to a polarity of a potential of the first voltage source, with respect to a potential of the second voltage source.

4. The switch circuit as claimed in claim 1,
   wherein the resistor is integrated with the driver circuit.

5. The switch circuit as claimed in claim 1,
   wherein the second switch element is an NPN transistor or an N-channel MOSFET, and
   wherein the overcurrent detector circuit sets the second control signal to a high level when the current flowing through the first switch element exceeds the threshold, and sets the second control signal to a low level when the current flowing through the first switch element is equal to or smaller than the threshold.

6. The switch circuit as claimed in claim 1,
   wherein the second switch element is a PNP transistor or a P-channel MOSFET, and
   wherein the overcurrent detector circuit sets the second control signal to a low level when the current flowing through the first switch element exceeds the threshold, and sets the second control signal to a high level when the current flowing through the first switch element is equal to or smaller than the threshold.

7. A power converter apparatus comprising at least one switch circuit, the at least one switch circuit comprising:
   a first switch element that has a first terminal connected to a first voltage source, a second terminal connected to a second voltage source, and a third terminal;
   a driver circuit that generates a first control signal for turning the first switch element on and off;
   a resistor that is connected between the driver circuit and the third terminal;
   a second switch element that has a fourth terminal connected to the third terminal, a fifth terminal connected to the second voltage source, and a sixth terminal;
   an overcurrent detector circuit that generates a second control signal based on whether or not a current flowing through the first switch element exceeds a predetermined threshold; and
   a PWM control circuit that is connected between the overcurrent detector circuit and the sixth terminal, and generates a PWM signal for turning the second switch element on and off, the PWM signal having a variable duty cycle depending on the second control signal, wherein the duty cycle of the PWM signal is adjusted so as to adjust an ON time of the second switch element.

* * * * *